(12) United States Patent
Murakami et al.

(10) Patent No.: US 11,140,500 B2
(45) Date of Patent: Oct. 5, 2021

(54) ELECTROACOUSTIC TRANSDUCTION FILM AND MANUFACTURING METHOD THEREOF, ELECTROACOUSTIC TRANSDUCER, FLEXIBLE DISPLAY, VOCAL CORD MICROPHONE, SENSOR FOR MUSICAL INSTRUMENT

(71) Applicant: FUJIFILM Corporation, Tokyo (JP)

(72) Inventors: Naoki Murakami, Ashigara-kami-gun (JP); Tetsu Miyoshi, Ashigara-kami-gun (JP)

(73) Assignee: FUJIFILM Corporation, Tokyo (JP)

(\*) Notice: Subject to any disclaimer, the term of this patent is extended or adjusted under 35 U.S.C. 154(b) by 940 days.

(21) Appl. No.: 15/868,146

(22) Filed: Jan. 11, 2018

(65) Prior Publication Data

US 2018/0160248 A1 Jun. 7, 2018

Related U.S. Application Data

(63) Continuation of application No. PCT/JP2016/071392, filed on Jul. 21, 2016.

(30) Foreign Application Priority Data

Jul. 27, 2015 (JP) .............................. JP2015-147608
Jan. 6, 2016 (JP) .............................. JP2016-001221

(51) Int. Cl.
*H04R 31/00* (2006.01)
*H04R 1/46* (2006.01)
(Continued)

(52) U.S. Cl.
CPC ............. *H04R 31/003* (2013.01); *G10H 3/14* (2013.01); *G10H 3/143* (2013.01); *H01L 41/257* (2013.01);
(Continued)

(58) Field of Classification Search
CPC .... H04R 31/003; H04R 17/005; H04R 17/02; H04R 1/46; H04R 7/10; H04R 2307/023;
(Continued)

(56) References Cited

U.S. PATENT DOCUMENTS

2009/0324954 A1 12/2009 Nakajima
2014/0210309 A1 7/2014 Miyoshi

FOREIGN PATENT DOCUMENTS

JP 2010-30875 A 2/2010
JP 2014-14063 A 1/2014
(Continued)

OTHER PUBLICATIONS

English machine translation of KR 10-1442632 (Nam et al., Piezoelectric Composite Film and Piezoelectric Apparatus Using the Same, published Sep. 2014) (Year: 2014).*
(Continued)

*Primary Examiner* — Mark Fischer
(74) *Attorney, Agent, or Firm* — Birch, Stewart, Kolasch & Birch, LLP

(57) ABSTRACT

Provided are an electroacoustic transduction film capable of reproducing a sound with a sufficient sound volume at a high conversion efficiency, a manufacturing method thereof, an electroacoustic transducer, a flexible display, a vocal cord microphone, and a sensor for a musical instrument. The electroacoustic transduction film includes: a polymer composite piezoelectric body in which piezoelectric body particles are dispersed in a viscoelastic matrix formed of a polymer material having viscoelasticity at a normal temperature; two thin film electrodes laminated on both surfaces of the polymer composite piezoelectric body; and two protective layers respectively laminated on the two thin film electrodes, in which an intensity ratio $\alpha_1$=(002) plane peak intensity/((002) plane peak intensity+(200) plane peak
(Continued)

intensity) between a (002) plane peak intensity and a (200) plane peak intensity derived from the piezoelectric body particles in a case where the polymer composite piezoelectric body is evaluated by an X-ray diffraction method is more than or equal to 0.6 and less than 1.

12 Claims, 8 Drawing Sheets

(51) Int. Cl.
| | |
|---|---|
| H04R 17/02 | (2006.01) |
| H04R 17/00 | (2006.01) |
| H04R 7/10 | (2006.01) |
| H01L 41/18 | (2006.01) |
| H01L 41/257 | (2013.01) |
| G10H 3/14 | (2006.01) |

(52) U.S. Cl.
CPC ........... H04R 17/005 (2013.01); H04R 17/02 (2013.01); *G10H 2220/535* (2013.01); *G10H 2220/541* (2013.01); *G10H 2220/551* (2013.01); *G10H 2220/555* (2013.01); *H01L 41/183* (2013.01); *H04R 1/46* (2013.01); *H04R 7/10* (2013.01); *H04R 2307/023* (2013.01); *H04R 2307/025* (2013.01); *H04R 2499/15* (2013.01)

(58) Field of Classification Search
CPC .......... H04R 2307/025; H04R 2499/15; G10H 3/14; G10H 3/143; G10H 2220/535; G10H 2220/541; G10H 2220/551; G10H 2220/555; H01L 41/257; H01L 41/183
See application file for complete search history.

(56) References Cited

FOREIGN PATENT DOCUMENTS

| KR | 20080048643 A | * | 6/2008 |
|---|---|---|---|
| KR | 101442632 B1 | * | 9/2014 |

OTHER PUBLICATIONS

International Preliminary Report on Patentability and Written Opinion of the International Searching Authority (Form PCT/IPEA/409) for International Application No. PCT/JP2016/071392, dated Aug. 4, 2017, with English translation.

International Search Report and Written Opinion of the International Searching Authority (Forms PCT/ISA/210 and PCT/ISA/237) for International Application No. PCT/JP2016/071392, dated Oct. 4, 2016, with English translation of the International Search Report.

* cited by examiner

ELECTROACOUSTIC TRANSDUCTION FILM AND MANUFACTURING METHOD THEREOF, ELECTROACOUSTIC TRANSDUCER, FLEXIBLE DISPLAY, VOCAL CORD MICROPHONE, SENSOR FOR MUSICAL INSTRUMENT

CROSS-REFERENCE TO RELATED APPLICATIONS

This application is a Continuation of PCT International Application No. PCT/JP2016/071392 filed on Jul. 21, 2016, which claims priority under 35 U.S.C. § 119(a) to Japanese Patent Application No. 2015-147608 filed on Jul. 27, 2015 and Japanese Patent Application No. 2016-001221 filed on Jan. 6, 2016. Each of the above applications is hereby expressly incorporated by reference, in its entirety, into the present application.

BACKGROUND OF THE INVENTION

1. Field of the Invention

The present invention relates to an electroacoustic transduction film used for an acoustic device such as a speaker, a manufacturing method of the electroacoustic transduction film, an electroacoustic transducer which uses the electroacoustic transduction film, a flexible display, a vocal cord microphone, and a sensor for a musical instrument.

2. Description of the Related Art

In response to thinning and a reduction in weight of displays such as liquid crystal displays and organic electroluminescence (EL) displays, speakers used in such thin displays are also required to be lighter and thinner. In addition, in response to the development of flexible displays using a flexible substrate made of plastic or the like, speakers used therein are also required to be flexible.

Here, as the shape of a speaker of the related art, a so-called cone shape such as a funnel-like shape, a spherical dome-like shape, and the like are generally used. However, in a case where such a speaker is embedded in the thin display described above, there is concern that thinning may not be sufficiently achieved and lightweight properties and flexibility may be impaired. In addition, in a case where the speaker is attached to the outside of the thin display, it is difficult to carry the thin display.

Here, as a speaker which is thin and is able to be integrated with a thin display or a flexible display without impairing the lightweight properties or flexibility, it has been proposed to use a piezoelectric film which has flexibility in the form of a sheet and has a property that stretches and contracts in response to an applied voltage.

Here, the present applicants suggested, as a piezoelectric film which has flexibility in the form of a sheet and is able to stably reproduce a sound with high acoustic quality, an electroacoustic transduction film disclosed in JP2014-14063A. The electroacoustic transduction film disclosed in JP2014-14063A includes a polymer composite piezoelectric body (piezoelectric layer) in which piezoelectric body particles are dispersed in a viscoelastic matrix formed of a polymer material having viscoelasticity at a normal temperature, thin film electrodes formed on both surfaces of the polymer composite piezoelectric body, and protective layers formed on the surfaces of the thin film electrodes.

In such an electroacoustic transduction film, a ferroelectric material such as PZT (lead zirconate titanate) is used as piezoelectric body particles. The crystal structure of the ferroelectric material is divided into many domains (domains) with different spontaneous polarization directions. In this state, the spontaneous polarization in each domain and the correspondingly generated piezoelectric effect cancel each other, so that no piezoelectric properties are seen as a whole.

The spontaneous polarization directions of the domains are aligned (oriented) by performing electric polarization processing such as corona poling and externally applying an electric field with a certain value or more. The piezoelectric body particles subjected to the electric polarization processing exhibit the piezoelectric effect in response to the externally applied electric field.

In the electroacoustic transduction film, since the piezoelectric layer contains the piezoelectric body particles having such piezoelectric properties, the transduction film itself stretches and contracts in the surface direction thereof in response to an applied voltage and vibrates in a direction perpendicular to the surface, thereby performing a conversion between a vibration (sound) and an electrical signal.

SUMMARY OF THE INVENTION

In order to further improve a sound pressure (conversion efficiency) in such an electroacoustic transduction film, the present inventors considered a further increase in the orientation of each domain in the piezoelectric body particles through polarization processing for a further increase in piezoelectric properties.

In general, an X-ray diffraction method (XRD) is used as a method for analyzing a crystal structure, and the arrangement of atoms in crystals is examined by XRD.

Here, as an index of the orientation, the intensity ratio: (002) plane peak intensity/((002) plane peak intensity+(200) plane peak intensity) between a (002) plane peak intensity and a (200) plane peak intensity derived from the piezoelectric body particles in a case where the polymer composite piezoelectric body is evaluated by the X-ray diffraction method was used, and a further improvement in the sound pressure of the electroacoustic transduction film was examined by controlling the intensity ratio.

Here, in Ferroelectrics Volume 62, Issue 1, 167, (1985), it is described that the ratio between a (002) plane peak intensity and a (200) plane peak intensity is controlled by increasing a poling electric field during electric polarization processing. However, there is a limit to the control to increase the poling electric field during electric polarization processing, and the intensity ratio: (002) plane peak intensity/((002) plane peak intensity+(200) plane peak intensity) is saturated at around 0.55, and a higher intensity ratio cannot be obtained. Therefore, a higher conversion efficiency could not be obtained, and a higher sound pressure could not be obtained.

An object of the present invention is to solve such a problem of the related art, and is to provide an electroacoustic transduction film capable of reproducing a sound with a sufficient sound volume at a high conversion efficiency, a manufacturing method thereof, an electroacoustic transducer, a flexible display, a vocal cord microphone, and a sensor for a musical instrument.

The present inventors have intensively studied to attain the object, and found that by providing a polymer composite piezoelectric body in which piezoelectric body particles are dispersed in a viscoelastic matrix formed of a polymer material having viscoelasticity at a normal temperature, two thin film electrodes laminated on both surfaces of the polymer composite piezoelectric body, and two protective layers respectively laminated on the two thin film electrodes, and by causing an intensity ratio $\alpha_1$=(002) plane peak intensity/((002) plane peak intensity+(200) plane peak intensity) between a (002) plane peak intensity and a (200) plane peak intensity derived from the piezoelectric body particles in a case where the polymer composite piezoelectric body is evaluated by an X-ray diffraction method to be more than or equal to 0.6 and less than 1, the problem can be solved, thereby completing the present invention.

That is, the present invention provides an electroacoustic transduction film having the following configuration, a manufacturing method thereof, an electroacoustic transducer using the electroacoustic transduction film, a flexible display, a vocal cord microphone, and a sensor for a musical instrument.

(1) An electroacoustic transduction film comprising: a polymer composite piezoelectric body in which piezoelectric body particles are dispersed in a viscoelastic matrix formed of a polymer material having viscoelasticity at a normal temperature; two thin film electrodes laminated on both surfaces of the polymer composite piezoelectric body; and two protective layers respectively laminated on the two thin film electrodes, in which an intensity ratio $\alpha_1$=(002) plane peak intensity/((002) plane peak intensity+(200) plane peak intensity) between a (002) plane peak intensity and a (200) plane peak intensity derived from the piezoelectric body particles in a case where the polymer composite piezoelectric body is evaluated by an X-ray diffraction method is more than or equal to 0.6 and less than 1.

(2) The electroacoustic transduction film according to (1), in which the intensity ratio al is more than or equal to 0.67 and less than or equal to 0.75.

(3) The electroacoustic transduction film according to (1) or (2), in which the polymer material has a cyanoethyl group.

(4) The electroacoustic transduction film according to any one of (1) to (3), in which the polymer material is cyanoethylated polyvinyl alcohol.

(5) A manufacturing method of an electroacoustic transduction film including a polymer composite piezoelectric body in which piezoelectric body particles are dispersed in a viscoelastic matrix formed of a polymer material having viscoelasticity at a normal temperature, two thin film electrodes laminated on both surfaces of the polymer composite piezoelectric body, and two protective layers respectively laminated on the two thin film electrodes, the method comprising: a preparation step of preparing electrode laminated bodies in each of which one of the thin film electrodes and one of the protective layers are laminated; a first lamination step of producing a first laminated body by laminating one of the electrode laminated bodies and the polymer composite piezoelectric body; an electric polarization processing step of performing electric polarization processing on the polymer composite piezoelectric body of the first laminated body; a second lamination step of producing a second laminated body by laminating the other electrode laminated body on the surface of the polymer composite piezoelectric body on which no electrode laminated body is laminated; and a mechanical polarization processing step of performing mechanical polarization processing on the second laminated body.

(6) The manufacturing method of an electroacoustic transduction film according to (5), in which, in the mechanical polarization processing step, the mechanical polarization processing is performed by applying a shear stress to the second laminated body using a roller.

(7) The manufacturing method of an electroacoustic transduction film according to (6), in which, in the mechanical polarization processing step, the shear stress applied of the second laminated body is 0.3 MPa to 0.5 MPa.

(8) The manufacturing method of an electroacoustic transduction film according to any one of (5) to (7), in which, in the electric polarization processing step, the electric polarization processing is performed by corona poling processing.

(9) An electroacoustic transducer comprising: the electroacoustic transduction film according to any one of (1) to (4).

(10) A flexible display comprising: the electroacoustic transduction film according to any one of (1) to (4) attached to a surface of the flexible display having flexibility, the surface being opposite to an image display surface.

(11) A vocal cord microphone comprising: the electroacoustic transduction film according to any one of (1) to (4) used as a sensor.

(12) A sensor for a musical instrument comprising: the electroacoustic transduction film according to any one of (1) to (4) used as a sensor.

According to the present invention, it is possible to provide the capable of reproducing a sound with a sufficient sound volume at a high conversion efficiency, the manufacturing method thereof, the electroacoustic transducer, the flexible display, the vocal cord microphone, and the sensor for a musical instrument.

DESCRIPTION OF THE PREFERRED EMBODIMENTS

Hereinafter, an electroacoustic transduction film, a manufacturing method thereof, an electroacoustic transducer, a flexible display, a vocal cord microphone, and a sensor for a musical instrument of the present invention will be described in detail based on the preferred embodiments shown in the accompanying drawings.

Descriptions of the constituent elements described below may be made based on representative embodiments of the present invention, but the present invention is not limited to the embodiments.

In this specification, a numerical range expressed by using "to" means a range including numerical values described before and after "to" as a lower limit and an upper limit.

As will be described later, the electroacoustic transduction film of the present invention is used as a vibration plate of the electroacoustic transducer.

In the electroacoustic transducer, in a case where the electroacoustic transduction film is stretched in an in-plane direction due to the application of a voltage to the electroacoustic transduction film, the electroacoustic transduction film moves upward (in the radial direction of sound) in order to absorb the stretching. Conversely, in a case where the electroacoustic transduction film is contracted in the in-plane direction due to the application of a voltage to the electroacoustic transduction film, the electroacoustic transduction film moves downward (toward a case) in order to absorb the contraction. The electroacoustic transducer performs a conversion between a vibration (sound) and an electrical signal by the vibrations caused by repetition of stretching and contraction of the electroacoustic transduction film, and is used to reproduce a sound from a vibration in response to an electrical signal by inputting the electrical signal to the electroacoustic transduction film, convert a vibration of the electroacoustic transduction film from the received sound waves into an electrical signal, or impart tactility or transport an object from vibrations.

Specifically, various acoustic devices including a speaker such as a full-range speaker, a tweeter, a squawker, and a woofer, a speaker for a headphone, a noise canceller, a microphone, a pickup used in musical instruments including a guitar, and the like can be cited. In addition, the electroacoustic transduction film of the present invention is a non-magnetic body, and thus is able to be suitably used as a noise canceller for MRI among other noise cancellers.

Furthermore, the electroacoustic transducer of the present invention is thin, lightweight, and bendable, and thus is suitably used in wearable products such as hats, mufflers and clothes, thin displays such as televisions and digital signages, ceilings of buildings and automobiles, curtains, umbrellas, wallpapers, windows, beds, and the like.

Figure 1:
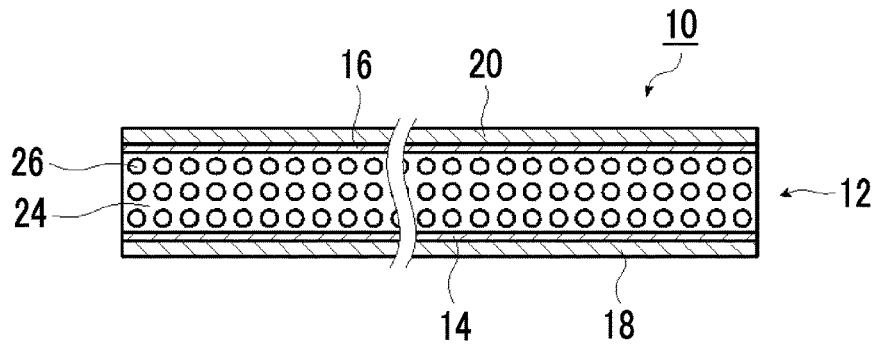
FIG. 1 is a sectional view schematically illustrating an example of an electroacoustic transduction film of the present invention.

FIG. 1 is a sectional view schematically illustrating an example of the electroacoustic transduction film of the present invention.

As illustrated in FIG. 1, an electroacoustic transduction film (hereinafter, also referred to as "transduction film") 10 of the present invention has a piezoelectric layer 12 which is a sheet-like material having piezoelectric properties, a lower thin film electrode 14 laminated on one surface of the piezoelectric layer 12, a lower protective layer 18 laminated on the lower thin film electrode 14, an upper thin film electrode 16 laminated on the other surface of the piezoelectric layer 12, and an upper protective layer 20 laminated on the upper thin film electrode 16.

Here, in the transduction film 10 of the present invention, in a case where the piezoelectric layer 12 formed of the polymer composite piezoelectric body is evaluated by an X-ray diffraction method, the intensity ratio $\alpha_1$=(002) plane peak intensity/((002) plane peak intensity+(200) plane peak intensity) between a (002) plane peak intensity and a (200) plane peak intensity derived from the piezoelectric body particles is more than or equal to 0.6 and less than 1.

These points will be described in detail later.

In the transduction film 10, the piezoelectric layer 12 which is a polymer composite piezoelectric body, as conceptually illustrated in FIG. 1, is a polymer composite piezoelectric body in which piezoelectric body particles 26 are uniformly dispersed in a viscoelastic matrix 24 formed of a polymer material having viscoelasticity at a normal temperature. Furthermore, herein, the "normal temperature" indicates a temperature range of approximately 0° C. to 50° C.

Although described later, the piezoelectric layer 12 is subjected to polarization processing.

Here, it is preferable that the polymer composite piezoelectric body (the piezoelectric layer) 12 has the following requisites.

(i) Flexibility

For example, in a case of being gripped in a state of being loosely bent like a newspaper or a magazine as a portable device, the polymer composite piezoelectric body is continuously subjected to large bending deformation from the outside at a comparatively slow vibration of less than or equal to a few Hz. At this time, in a case where the polymer composite piezoelectric body is hard, large bending stress is generated to that extent, and a crack is generated at the interface between the polymer matrix and the piezoelectric body particles, possibly leading to breakage. Accordingly, the polymer composite piezoelectric body is required to have suitable flexibility. In addition, in a case where strain energy is diffused into the outside as heat, the stress is able to be relieved. Accordingly, the loss tangent of the polymer composite piezoelectric body is required to be suitably large.

(ii) Acoustic Quality

In the speaker, the piezoelectric body particles vibrate at a frequency of an audio band of 20 Hz to 20 kHz, and the entire vibration plate (the polymer composite piezoelectric body) integrally vibrates due to the vibration energy such that a sound is reproduced. Accordingly, in order to increase the transmission efficiency of the vibration energy, the polymer composite piezoelectric body is required to have suitable hardness. In addition, in a case where the frequency properties of the speaker become smooth, the changed amount of the acoustic quality at the time of when the lowest resonance frequency $f_0$ changes according to a change in the curvature also decreases. Accordingly, the loss tangent of the polymer composite piezoelectric body is required to be suitably large.

As described above, the polymer composite piezoelectric body is required to be rigid with respect to a vibration of 20 Hz to 20 kHz, and be flexible with respect to a vibration of less than or equal to a few Hz. In addition, the loss tangent of the polymer composite piezoelectric body is required to be suitably large with respect to the vibration of all frequencies of less than or equal to 20 kHz.

In general, a polymer solid has a viscoelasticity relieving mechanism, and a molecular movement having a large scale is observed as a decrease (relief) in a storage elastic modulus (Young's modulus) or the local maximum (absorption) in a loss elastic modulus along with an increase in a temperature or a decrease in a frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer composite piezoelectric body (the piezoelectric layer 12), the polymer material of which the glass transition point is a normal temperature, in other words, the polymer material having viscoelasticity at a normal temperature is used in the matrix, and thus the polymer composite piezoelectric body which is rigid with respect to a vibration of 20 Hz to 20 kHz and is flexible with respect to a vibration of less than or equal to a few Hz is realized. In particular, from a viewpoint of preferably exhibiting such behavior, it is preferable that a polymer material of which the glass transition temperature at a frequency of 1 Hz is a normal temperature, that is, 0° C. to 50° C. is used in the matrix of the polymer composite piezoelectric body.

As the polymer material having viscoelasticity at a normal temperature, various known materials are able to be used. Preferably, a polymer material of which the local maximum value of a loss tangent Tan δ at a frequency of 1 Hz at a normal temperature, that is, 0° C. to 50° C. in a dynamic viscoelasticity test is greater than or equal to 0.5 is used.

Accordingly, in a case where the polymer composite piezoelectric body is slowly bent due to an external force, stress concentration on the interface between the polymer matrix and the piezoelectric body particles at the maximum bending moment portion is relieved, and thus high flexibility is able to be expected.

In addition, it is preferable that, in the polymer material, a storage elastic modulus (E') at a frequency of 1 Hz according to dynamic viscoelasticity measurement is greater than or equal to 100 MPa at 0° C. and is less than or equal to 10 MPa at 50° C.

Accordingly, it is possible to reduce a bending moment which is generated at the time of when the polymer composite piezoelectric body is slowly bent due to the external force, and it is possible to make the polymer composite piezoelectric body rigid with respect to an acoustic vibration of 20 Hz to 20 kHz.

In addition, it is more preferable that the relative permittivity of the polymer material is greater than or equal to 10 at 25° C. Accordingly, in a case where a voltage is applied to the polymer composite piezoelectric body, a higher electric field is applied to the piezoelectric body particles in the polymer matrix, and thus a large deformation amount is able to be expected.

However, in consideration of ensuring excellent moisture resistance or the like, it is preferable that the relative permittivity of the polymer material is less than or equal to 10 at 25° C.

As the polymer material satisfying such conditions, cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, polybutyl methacrylate, and the like are exemplified.

In addition, a polymer material having a cyanoethyl group such as a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, and a polyvinylidene fluoride-tetrafluoroethylene copolymer, a polymer having a cyano group or a cyanoethyl group such as a vinylidene cyanide-vinyl acetate copolymer, cyanoethyl cellulose, cyanoethyl hydroxy saccharose, cyanoethyl hydroxy cellulose, cyanoethyl hydroxy pullulan, cyanoethyl methacrylate, cyanoethyl acrylate, cyanoethyl hydroxy ethyl cellulose, cyanoethyl amylose, cyanoethyl hydroxy propyl cellulose, cyanoethyl dihydroxy propyl cellulose, cyanoethyl hydroxy propyl amylose, cyanoethyl polyacryl amide, cyanoethyl polyacrylate, cyanoethyl pullulan, cyanoethyl polyhydroxy methylene, cyanoethyl glycidol pullulan, cyanoethyl saccharose, and cyanoethyl sorbitol, a synthetic rubber such as nitrile rubber or chloroprene rubber, and the like are exemplified.

In addition, as these polymer materials, a commercially available product such as Hybrar 5127 (manufactured by Kuraray Co., Ltd.) is also able to be suitably used. Among them, a material having a cyanoethyl group is preferably used, and cyanoethylated PVA is particularly preferably used.

Furthermore, only one of these polymer materials may be used, or a plurality of types thereof may be used in combination (mixture).

The viscoelastic matrix 24 using such a polymer material having viscoelasticity at a normal temperature, as necessary, may use a plurality of polymer materials in combination.

That is, in order to adjust dielectric properties or mechanical properties, other dielectric polymer materials may be added to the viscoelastic matrix 24 in addition to the viscoelastic material such as cyanoethylated PVA, as necessary.

As the dielectric polymer material which is able to be added to the matrix 24, for example, a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, and a polyvinylidene fluoride-tetrafluoroethylene copolymer, a polymer having a cyano group or a cyanoethyl group such as a vinylidene cyanide-vinyl acetate copolymer, cyanoethyl cellulose, cyanoethyl hydroxy saccharose, cyanoethyl hydroxy cellulose, cyanoethyl hydroxy pullulan, cyanoethyl methacrylate, cyanoethyl acrylate, cyanoethyl hydroxy ethyl cellulose, cyanoethyl amylose, cyanoethyl hydroxy propyl cellulose, cyanoethyl dihydroxy propyl cellulose, cyanoethyl hydroxy propyl amylose, cyanoethyl polyacryl amide, cyanoethyl polyacrylate, cyanoethyl pullulan, cyanoethyl polyhydroxy methylene, cyanoethyl glycidol pullulan, cyanoethyl saccharose, and cyanoethyl sorbitol, a synthetic rubber such as nitrile rubber or chloroprene rubber, and the like are exemplified.

Among them, a polymer material having a cyanoethyl group is suitably used.

Furthermore, the dielectric polymer added to the viscoelastic matrix 24 of the piezoelectric layer 12 in addition to the material having viscoelasticity at a normal temperature such as cyanoethylated PVA is not limited to one dielectric polymer, and a plurality of dielectric polymers may be added.

In addition, in order to adjust the glass transition point Tg, a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, and mica may be added in addition to the dielectric polymer material.

Furthermore, in order to improve pressure sensitive adhesiveness, a viscosity imparting agent such as rosin ester, rosin, terpene, terpene phenol, and a petroleum resin may be added.

In the viscoelastic matrix 24 of the piezoelectric layer 12, the added amount at the time of adding a polymer in addition to the viscoelastic material such as cyanoethylated PVA is not particularly limited, and it is preferable that a ratio of the added polymer to the viscoelastic matrix 24 is less than or equal to 30 vol %.

Accordingly, it is possible to exhibit properties of the polymer material to be added without impairing the viscoelasticity relieving mechanism of the viscoelastic matrix 24, and thus a preferred result is able to be obtained from a viewpoint of increasing a dielectric constant, of improving heat resistance, and of improving adhesiveness between the piezoelectric body particles 26 and the electrode layer.

In addition, for the purpose of increasing the dielectric constant of the piezoelectric layer 12, dielectric particles may be added to the viscoelastic matrix.

The dielectric particles are formed of particles having a relative permittivity as high as 80 or more at 25° C.

As the dielectric particles, lead zirconate titanate (PZT), barium titanate ($BaTiO_3$), titanium oxide ($TiO_2$), strontium titanate ($SrTiO_3$), lead lanthanum zirconate titanate (PLZT), zinc oxide (ZnO), a solid solution (BFBT) of barium titanate and bismuth ferrite ($BiFeO_3$), and the like are exemplified. Among them, it is preferable to use barium titanate ($BaTiO_3$) as the dielectric particles from a viewpoint of having a high relative permittivity.

It is preferable that the average particle diameter of the dielectric particles is less than or equal to 0.5 µm.

In addition, the volume fraction of the dielectric particles with respect to the total volume of the viscoelastic matrix and the dielectric particles is preferably 5% to 45%, more preferably 10% to 30%, and particularly preferably 20% to 30%.

The piezoelectric body particles 26 are formed of ceramics particles having a perovskite type or wurtzite type crystal structure.

As the ceramics particles configuring the piezoelectric body particles 26, for example, lead zirconate titanate (PZT), lead lanthanum zirconate titanate (PLZT), barium titanate ($BaTiO_3$), zinc oxide (ZnO), a solid solution (BFBT) of barium titanate and bismuth ferrite ($BiFe_3$), and the like are exemplified.

Furthermore, only one type of these ceramics particles may be used, or a plurality of types thereof may be used in combination.

The particle diameter of the piezoelectric body particles 26 may be appropriately selected according to the size or usage of the transduction film 10, and is preferably 1 µm to 10 µm according to the consideration of the present inventors.

By setting the particle diameter of the piezoelectric body particles 26 to be in the range described above, a preferred result is able to be obtained from a viewpoint of making high piezoelectric properties and flexibility compatible.

In addition, in FIG. 1, the piezoelectric body particles 26 in the piezoelectric layer 12 are uniformly dispersed in the viscoelastic matrix 24 with regularity. However, the present invention is not limited thereto.

That is, in the viscoelastic matrix 24, the piezoelectric body particles 26 in the piezoelectric layer 12 are preferably uniformly dispersed, and may also be irregularly dispersed.

In the transduction film 10, a quantitative ratio of the viscoelastic matrix 24 and the piezoelectric body particles 26 in the piezoelectric layer 12 may be appropriately set according to the size in the surface direction or the thickness of the transduction film 10, the usage of the transduction film 10, properties required for the transduction film 10, and the like.

Here, according to the consideration of the present inventors, the volume fraction of the piezoelectric body particles 26 in the piezoelectric layer 12 is preferably 30% to 70%, particularly preferably greater than or equal to 50%. Therefore, the volume fraction thereof is more preferably 50% to 70%.

By setting the quantitative ratio of the viscoelastic matrix 24 and the piezoelectric body particles 26 to be in the range described above, it is possible to obtain a preferred result from a viewpoint of making high piezoelectric properties and flexibility compatible.

In addition, in the transduction film 10, the thickness of the piezoelectric layer 12 is also not particularly limited, and may be appropriately set according to the size of the transduction film 10, the usage of the transduction film 10, properties required for the transduction film 10, and the like.

Here, according to the consideration of the present inventors, the thickness of the piezoelectric layer 12 is preferably 8 to 300 µm, more preferably 8 to 40 µm, even more preferably 10 to 35 µm and particularly preferably 15 to 25 µm.

By setting the thickness of the piezoelectric layer 12 to be in the range described above, it is possible to obtain a preferred result from a viewpoint of making ensuring rigidity and appropriate flexibility compatible.

Here, the piezoelectric layer 12 is subjected to electric polarization processing (poling) and mechanical polarization processing.

By subjecting the piezoelectric layer 12 to the electric polarization processing and mechanical polarization processing, in the case where the piezoelectric layer 12 is evaluated by an X-ray diffraction method, the intensity ratio $\alpha_1$ between the (002) plane peak intensity and the (200) plane peak intensity derived from the piezoelectric body particles is more than or equal to 0.6 and less than 1.

The electric polarization processing, the mechanical polarization processing, and the intensity ratio $\alpha_1$ will be described later in detail.

As illustrated in FIG. 1, the transduction film 10 of the present invention has a configuration in which the lower thin film electrode 14 is formed on one surface of the piezoelectric layer 12, the lower protective layer 18 is formed on the lower thin film electrode 14, the upper thin film electrode 16 is formed on the other surface of the piezoelectric layer 12, the upper protective layer 20 is formed on the upper thin film electrode 16. Here, the upper thin film electrode 16 and the lower thin film electrode 14 form an electrode pair.

In addition to these layers, the transduction film 10 may further include, for example, an electrode lead-out portion that leads out the electrodes from the upper thin film electrode 16 and the lower thin film electrode 14, and an insulating layer which covers a region where the piezoelectric layer 12 is exposed for preventing a short circuit or the like.

As the electrode lead-out portion, the thin film electrode and the protective layer are provided with parts protruding in a convex shape on the outside in the surface direction of the piezoelectric layer. Alternatively, the electrode lead-out portion may be provided by forming a hole by removing a portion of the protective layer, inserting a conductive material such as a silver paste into the hole, and electrically connecting the conductive material and the thin film electrode.

In each of the thin film electrodes, the number of electrode lead-out portions is not limited to one, and two or more electrode lead-out portions may be included. Particularly, in a case of the configuration in which the electrode lead-out portion is provided by removing a portion of the protective layer and inserting the conductive material into the hole, three or more electrode lead-out portions are provided to ensure more reliable electrical connection.

That is, the transduction film 10 has a configuration in which both surfaces of the piezoelectric layer 12 are interposed between the electrode pair, that is, the upper thin film electrode 16 and the lower thin film electrode 14 and is further interposed between the upper protective layer 20 and the lower protective layer 18.

The region interposed between the upper thin film electrode 16 and the lower thin film electrode 14 as described above is driven according to an applied voltage.

In the transduction film 10, the upper protective layer 20 and the lower protective layer 18 have a function of covering the upper thin film electrode 16 and the lower thin film electrode 14 and applying appropriate rigidity and mechanical strength to the piezoelectric layer 12. That is, there may be a case where, in the transduction film 10 of the present invention, the piezoelectric layer 12 consisting of the viscoelastic matrix 24 and the piezoelectric body particles 26 exhibits extremely superior flexibility under bending deformation at a slow vibration but has insufficient rigidity or mechanical strength depending on the usage. As a compensation for this, the transduction film 10 is provided with the upper protective layer 20 and the lower protective layer 18.

In addition, since the lower protective layer 18 and the upper protective layer 20 are different from each other only in position and have the same configuration, in the following description, in a case where there is no need to distinguish between the lower protective layer 18 and the upper protective layer 20, both the members are collectively referred to as a protective layer.

The protective layer is not particularly limited, and may use various sheet-like materials. As an example, various resin films are suitably exemplified. Among them, by the reason of excellent mechanical properties and heat resistance, polyethylene terephthalate (PET), polypropylene (PP), polystyrene (PS), polycarbonate (PC), polyphenylene sulfite (PPS), polymethyl methacrylate (PMMA), polyetherimide (PEI), polyimide (PI), polyamide (PA), polyethylene naphthalate (PEN), triacetylcellulose (TAC), and a cyclic olefin-based resin are suitably used.

The thickness of the protective layer is not particularly limited. In addition, the thicknesses of the upper protective layer 20 and the lower protective layer 18 may basically be identical to each other or different from each other.

Here, in a case where the rigidity of the protective layer excessively increases, not only is the stretching and contracting of the piezoelectric layer 12 constrained, but also the flexibility is impaired, and thus it is advantageous in a case where the thickness of the protective layer becomes thinner unless mechanical strength or excellent handling ability as a sheet-like material is required.

Here, according to the consideration of the present inventors, in a case where the thickness of each of the upper protective layer 20 and the lower protective layer 18 is less than or equal to twice the thickness of the piezoelectric layer 12, it is possible to obtain a preferred result from a viewpoint of compatibility between ensuring of the stiffness and appropriate flexibility, or the like.

For example, in a case where the thickness of the piezoelectric layer 12 is 50 µm and the lower protective layer 18 and the upper protective layer 20 are formed of PET, the thickness of each of the lower protective layer 18 and the upper protective layer 20 is preferably less than or equal to 100 µm, and more preferably less than or equal to 50 µm, and particularly preferably less than or equal to 25 µm.

In the transduction film 10, the upper thin film electrode (hereinafter, also referred to as an upper electrode) 16 is formed between the piezoelectric layer 12 and the upper protective layer 20, and the lower thin film electrode (hereinafter, also referred to as a lower electrode) 14 is formed between the piezoelectric layer 12 and the lower protective layer 18.

The upper electrode 16 and the lower electrode 14 are provided to apply an electric field to the transduction film 10 (the piezoelectric layer 12).

In addition, since the lower electrode 14 and the upper electrode 16 are different from each other only in size and position and have the same configuration, in the following description, in a case where there is no need to distinguish between the lower electrode 14 and the upper electrode 16, both the members are collectively referred to as a thin film electrode.

In the present invention, a forming material of the thin film electrode is not particularly limited, and as the forming material, various conductive bodies are able to be used. Specifically, carbon, palladium, iron, tin, aluminum, nickel, platinum, gold, silver, copper, chromium, molybdenum, or an alloy thereof, indium-tin oxide, a conductive polymer such as PEDOT/PPS (polyethylenedioxythiophene-polystyrene sulfonate) are exemplified. Among them, any one of copper, aluminum, gold, silver, platinum, and indium-tin oxide is suitably exemplified. From a viewpoint of conductivity, costs, flexibility, and the like, copper is more preferable.

In addition, a forming method of the protective layer is not particularly limited, and as the forming method, various known methods such as a vapor-phase deposition method (a vacuum film forming method) such as vacuum vapor deposition or sputtering, film formation using plating, a method of adhering a foil formed of the materials described above, and an application method are able to be used.

Among them, in particular, by the reason that the flexibility of the transduction film 10 is able to be ensured, a copper or aluminum thin film formed by using the vacuum vapor deposition is suitably used as the thin film electrode. Among them, in particular, the copper thin film formed by using the vacuum vapor deposition is suitably used.

The thicknesses of the upper electrode 16 and the lower electrode 14 are not particularly limited. In addition, the thicknesses of the upper electrode 16 and the lower electrode 14 may basically be identical to each other or different from each other.

Here, like the protective layer described above, in a case where the stiffness of the thin film electrode excessively increases, not only is stretching and contracting of the piezoelectric layer 12 constrained, but also flexibility is impaired. For this reason, in a case where the thin film electrode is in a range where electrical resistance does not excessively increase, it is advantageous as the thickness becomes thinner.

In addition, according to the consideration of the present inventors, in a case where the product of the thickness of the thin film electrode and the Young's modulus is less than the product of the thickness of the protective layer and the Young's modulus, the flexibility is not considerably impaired, which is suitable.

For example, in a case of a combination of the protective layer formed of PET (Young's modulus: approximately 6.2 GPa) and the thin film electrode formed of copper (Young's modulus: approximately 130 GPa), in a case where the thickness of the protective layer is 25 μm, the thickness of the thin film electrode is preferably less than or equal to 1.2 μm, more preferably less than or equal to 0.3 μm, and particularly preferably less than or equal to 0.1 μm.

As described above, the transduction film 10 has a configuration in which the piezoelectric layer 12 in which the piezoelectric body particles 26 are dispersed in the viscoelastic matrix 24 having viscoelasticity at a normal temperature is interposed between the upper electrode 16 and the lower electrode 14 and is further interposed between the upper protective layer 20 and the lower protective layer 18.

In the transduction film 10, it is preferable that the local maximum value in which the loss tangent (Tan δ) at a frequency of 1 Hz according to the dynamic viscoelasticity measurement is greater than or equal to 0.1 exists at a normal temperature.

Accordingly, even in a case where the transduction film 10 is subjected to large bending deformation from the outside at a comparatively slow vibration of less than or equal to a few Hz, it is possible to effectively diffuse the strain energy to the outside as heat, and thus it is possible to prevent a crack from being generated on the interface between the polymer matrix and the piezoelectric body particles.

In the transduction film 10, it is preferable that the storage elastic modulus (E') at a frequency of 1 Hz according to the dynamic viscoelasticity measurement is 10 GPa to 30 GPa at 0° C., and 1 GPa to 10 GPa at 50° C.

Accordingly, the transduction film 10 is able to have large frequency dispersion in the storage elastic modulus (E') at a normal temperature. That is, the transduction film 10 is able to be rigid with respect to a vibration of 20 Hz to 20 kHz, and is able to be flexible with respect to a vibration of less than or equal to a few Hz.

In addition, in the transduction film 10, it is preferable that the product of the thickness and the storage elastic modulus (E') at a frequency of 1 Hz according to the dynamic viscoelasticity measurement is $1.0 \times 10^6$ N/m to $2.0 \times 10^6$ (1.0E+06 to 2.0E+06) N/m at 0° C., and $1.0 \times 10^5$ N/m to $1.0 \times 10^6$ (1.0E+05 to 1.0E+06) N/m at 50° C.

Accordingly, the transduction film 10 is able to have appropriate rigidity and mechanical strength within a range not impairing the flexibility and the acoustic properties of the transduction film 10.

Furthermore, in the transduction film 10, it is preferable that the loss tangent (Tan δ) at a frequency of 1 kHz at 25° C. is greater than or equal to 0.05 in a master curve obtained by the dynamic viscoelasticity measurement.

Accordingly, the frequency properties of the speaker using the transduction film 10 become smooth, and thus it is also possible to decrease the changed amount of the acoustic quality at the time of when the lowest resonance frequency $f_0$ is changed according to the change in the curvature of the speaker.

Here, in the transduction film 10 of the present invention, in the case where the polymer composite piezoelectric body as the piezoelectric layer 12 is evaluated by the X-ray diffraction method, the intensity ratio $\alpha_1$=(002) plane peak intensity/((002) plane peak intensity+(200) plane peak intensity) between the (002) plane peak intensity and the (200) plane peak intensity derived from the piezoelectric body particles is more than or equal to 0.6 and less than 1.

As described above, in a transduction film which uses, as a piezoelectric layer, a polymer composite piezoelectric body in which piezoelectric body particles are dispersed in a viscoelastic matrix, a ferroelectric material such as PZT is used as the piezoelectric body particles. The crystal structure of the ferroelectric material is divided into many domains (domains) with different spontaneous polarization directions. In this state, the spontaneous polarization in each domain and the correspondingly generated piezoelectric effect cancel each other, so that no piezoelectric properties are seen as a whole.

Here, in the transduction film of the related art, the spontaneous polarization directions of the domains are aligned by performing electric polarization processing such as corona poling on the piezoelectric layer and externally applying an electric field with a certain value or more. The piezoelectric body particles subjected to the electric polarization processing exhibit the piezoelectric effect in response to the externally applied electric field. Accordingly, in the electroacoustic transduction film, the transduction film itself stretches and contracts in the surface direction thereof in response to an applied voltage and vibrates in a direction perpendicular to the surface, thereby performing a conversion between a vibration (sound) and an electrical signal.

However, the spontaneous polarization directions of the domains (domains) (hereinafter, also simply referred to as the directions of the domains) of the crystal structure of the ferroelectric material are directed along not only the thickness direction of the transduction film but also various directions such as the surface direction. Therefore, even in the case where the electric polarization processing is performed by applying a higher voltage, not all the directions of the domains directed along the surface direction can be directed along the thickness direction in which the electric field is applied. In other words, 90° domains cannot be completely removed.

Therefore, in the transduction film in the related art, the domains in the thickness direction of the transduction film (c domain) cannot be further increased, and higher piezoelectric properties cannot be obtained.

In general, an X-ray diffraction method (XRD) is used as a method for analyzing the crystal structure of such a piezoelectric layer (piezoelectric body particles), and the arrangement of atoms in crystals is examined by XRD.

When a piezoelectric film in the related art was analyzed by an X-ray analysis method (XRD), it was found that the intensity ratio $\alpha_1$=(002) plane peak intensity/((002) plane peak intensity+(200) plane peak intensity) between a (002) plane peak intensity and a (200) plane peak intensity derived from the piezoelectric body particles is saturated at around 0.55 even in a case where a poling electric field is increased during electric polarization processing, and a higher intensity ratio $\alpha_1$ cannot be obtained.

Here, the (002) plane peak intensity is a peak for a tetragonal structure at around 43.5° in an XRD pattern obtained by XRD analysis, and the (200) plane peak intensity is a peak for a tetragonal structure at around 45° in an XRD pattern obtained by XRD analysis.

The XRD analysis can be performed using an X-ray diffraction apparatus such as an X-ray diffractometer (Rint Ultima III manufactured by Rigaku Corporation).

In addition, the (002) plane peak intensity corresponds to the ratio of the domains in the thickness direction of the transduction film (c domains), and the (200) plane peak intensity corresponds to the ratio of the domains in the surface direction of the transduction film (a domains).

That is, the higher the intensity ratio $\alpha_1$ (the higher the ratio of the (002) plane peak intensity), the higher the ratio of the domains in the thickness direction of the transduction film (c domains). Therefore, higher piezoelectric properties can be obtained.

On the other hand, in the transduction film of the present invention, since the intensity ratio $\alpha_1$ between the (002) plane peak intensity and the (200) plane peak intensity derived from the piezoelectric body particles in the case where the polymer composite piezoelectric body as the piezoelectric layer 12 is evaluated by the X-ray diffraction method is more than or equal to 0.6 and less than 1, the ratio of the domains (c domains) in the thickness direction of the transduction film is high, and higher piezoelectric properties can be obtained. Therefore, the conversion efficiency between a vibration (sound) and an electrical signal can be further increased. Accordingly, in a case where the transduction film is used as a vibration plate of a speaker, the speaker can reproduce a sound with a sufficient sound volume. Furthermore, since the conversion efficiency is high, power consumption can be reduced.

Furthermore, as in the transduction film in the related art, in the case the ratio of the domains in the surface direction is high and a driving voltage is applied, the 90° domain wall is moved, which causes hysteresis of distortion. Therefore, there is concern that distortion may occur in the reproduced sound.

On the other hand, in the transduction film of the present invention, since the ratio of the domains in the surface direction (a domains) is low, in the case where the driving voltage is applied, 90° domain motion decreases, and thus the distortion in the reproduced sound decreases.

In addition, as a method of obtaining a piezoelectric layer with an intensity ratio $\alpha_1$ of more than or equal to 0.6 in a case where the piezoelectric layer is evaluated by XRD, there is a method of performing electric polarization processing and thereafter performing mechanical polarization processing. It is assumed that by further performing the mechanical polarization processing after performing the electric polarization processing, the domains in the surface direction of the transduction film (a domains) can be allowed to be directed along the thickness direction, and thus the ratio of the domains in the thickness direction (c domains) can be increased.

The electric polarization processing and the mechanical polarization processing will be described later in detail.

Here, the intensity ratio $\alpha_1$ is more preferably 0.67 to 0.75.

By setting the intensity ratio $\alpha_1$ to be in this range, higher piezoelectric properties can be obtained, and the conversion efficiency can be further increased.

In a case where the driving voltage is applied, the domains directed along the surface direction (a domains) may rotate to be directed along the thickness direction (the direction in which the driving voltage is applied). Since such 90° domain motion has power, the presence of this effect further increases the piezoelectric properties, and the piezoelectric properties become higher than in a case where all the domains are directed along the thickness direction.

Therefore, the piezoelectric properties can be further increased by leaving the domains directed along the surface direction (a domains) in a predetermined proportion by setting the intensity ratio $\alpha_1$ to be equal to or lower than 0.75.

Next, the manufacturing method of an electroacoustic transduction film of the present invention will be described.

The manufacturing method of an electroacoustic transduction film of the present invention is a manufacturing method of an electroacoustic transduction film including a polymer composite piezoelectric body in which piezoelectric body particles are dispersed in a viscoelastic matrix formed of a polymer material having viscoelasticity at a normal temperature, two thin film electrodes laminated on both surfaces of the polymer composite piezoelectric body, and two protective layers respectively laminated on the two thin film electrodes. The manufacturing method of an electroacoustic transduction film includes: a preparation step of preparing electrode laminated bodies in each of which one of the thin film electrodes and one of the protective layers are laminated; a first lamination step of producing a first laminated body by laminating one of the electrode laminated bodies and the polymer composite piezoelectric body; an electric polarization processing step of performing electric polarization processing on the polymer composite piezoelectric body of the first laminated body; a second lamination step of producing a second laminated body by laminating the other electrode laminated body on the surface of the polymer composite piezoelectric body on which no electrode laminated body is laminated; and a mechanical polarization processing step of performing mechanical polarization processing on the second laminated body.

Hereinafter, an example of a manufacturing method of the transduction film 10 will be described with reference to FIGS. 2A to 2E and FIG. 3.

The preparation step is a step of preparing the electrode laminated body in which the single thin film electrode and the single protective layer are laminated.

Figure 2A:
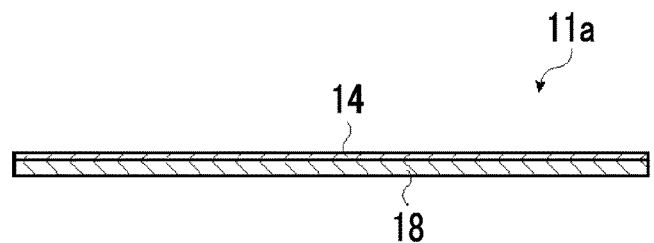
FIG. 2A is a conceptual view illustrating an example of a manufacturing method of the electroacoustic transduction film.

First, as illustrated in FIG. 2A, a lower electrode laminated body 11a which is a sheet-like material in which the lower electrode 14 is formed on the lower protective layer 18 is prepared.

Figure 2B:
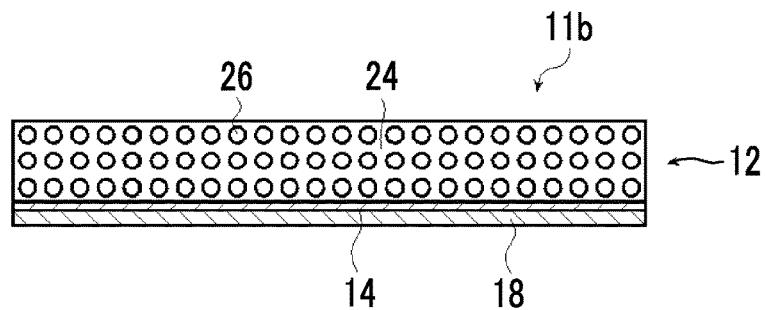
FIG. 2B is a conceptual view illustrating the example of the manufacturing method of the electroacoustic transduction film.
Figure 2C:
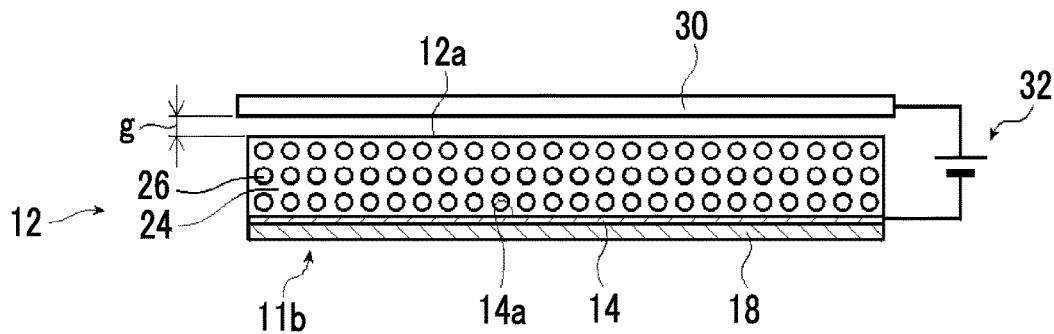
FIG. 2C is a conceptual view illustrating the example of the manufacturing method of the electroacoustic transduction film.
Figure 2D:
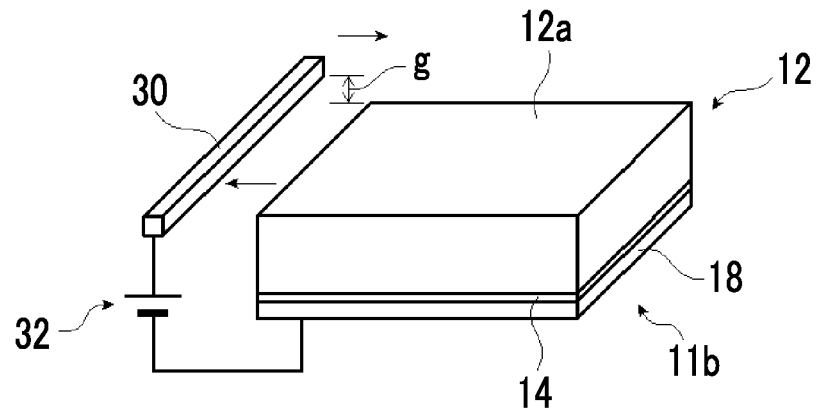
FIG. 2D is a conceptual view illustrating the example of the manufacturing method of the electroacoustic transduction film.
Figure 2E:
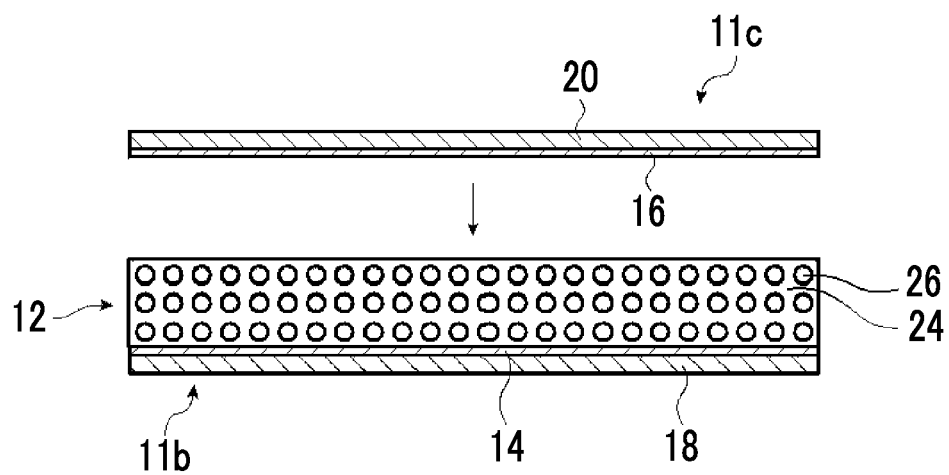
FIG. 2E is a conceptual view illustrating the example of the manufacturing method of the electroacoustic transduction film.

In addition, as illustrated in FIG. 2E, an upper electrode laminated body 11c which is a sheet-like material in which the upper thin film electrode 16 and the upper protective layer 20 are laminated is prepared.

The lower electrode laminated body 11a may be prepared by forming a copper thin film or the like as the lower thin film electrode 14 on the surface of the lower protective layer 18 using vacuum vapor deposition, sputtering, plating, and the like.

Similarly, the upper electrode laminated body 11c may be prepared by forming a copper thin film or the like as the upper thin film electrode 16 on the surface of the upper protective layer 20 using vacuum vapor deposition, sputtering, plating, and the like.

In a case where the protective layer is extremely thin, and thus the handleability is degraded, the protective layer with a separator (temporary supporter) may be used. As the separator, a PET film having a thickness of approximately 25 to 100 μm, and the like are able to be used. The separator may be removed after thermal compression bonding of the thin film electrode and the protective layer immediately before forming a side surface insulating layer, a second protective layer, and the like.

The first lamination step is the step of producing the first laminated body by laminating the lower electrode laminated body and the polymer composite piezoelectric body.

Specifically, the first laminated body 11b in which the lower electrode laminated body 11a and the piezoelectric layer 12 are laminated is produced by applying a coating composition that is to become the piezoelectric layer 12 onto the lower electrode 14 of the lower electrode laminated body 11a and thereafter curing the coating composition to form the piezoelectric layer 12.

First, a coating material is prepared by dissolving a polymer material (hereinafter, also referred to as a viscoelastic material) having viscoelasticity at a normal temperature, such as cyanoethylated PVA, in an organic solvent, further adding the piezoelectric body particles 26 such as PZT particles thereto, and stirring and dispersing the resultant. The organic solvent is not particularly limited, and as the organic solvent, various organic solvents such as dimethylformamide (DMF), methyl ethyl ketone, and cyclohexanone are able to be used.

In a case where the lower electrode laminated body 11a described above is prepared and the coating material is prepared, the coating material is cast (applied) onto the lower electrode laminated body 11a, and the organic solvent is evaporated and dried. Accordingly, as illustrated in FIG. 2B, the first laminated body 11b in which the lower thin film electrode 14 is provided on the lower protective layer 18 and the piezoelectric layer 12 is laminated on the lower thin film electrode 14 is prepared.

A casting method of the coating material is not particularly limited, and as the casting method, all known methods (coating devices) such as a slide coater or a doctor blade are able to be used.

Alternatively, in a case where the viscoelastic material is a material that is able to be heated and melted like cyanoethylated PVA, a melted material is prepared by heating and melting the viscoelastic material and adding and dispersing the piezoelectric body particles 26 therein, is extruded into a sheet shape on the lower electrode laminated body 11a illustrated in FIG. 2A by extrusion molding or the like, and is cooled, thereby preparing the first laminated body 11b as illustrated in FIG. 2B.

In addition, as described above, in the transduction film 10, in addition to the viscoelastic material such as cyanoethylated PVA, a polymer piezoelectric material such as PVDF may be added to the viscoelastic matrix 24.

In the case where the polymer piezoelectric material is added to the viscoelastic matrix 24, the polymer piezoelectric material added to the coating material may be dissolved. Alternatively, the polymer piezoelectric material to be added may be added to the heated and melted viscoelastic material and may be heated and melted.

The electric polarization processing step is the step of performing electric polarization processing (poling) on the piezoelectric layer 12 of the first laminated body 11b in which the lower electrode 14 is provided on the lower protective layer 18 and the piezoelectric layer 12 is formed on the lower electrode 14.

An electric polarization processing method of the piezoelectric layer 12 is not particularly limited, and a known method is able to be used. As a preferred electric polarization processing method, an electric polarization processing method using corona poling illustrated in FIGS. 2C and 2D is exemplified.

In this method, as illustrated in FIGS. 2C and 2D, for example, a gap g of 1 mm is opened on an upper surface 12a of the piezoelectric layer 12 of the first laminated body 11b, and a rod-like or wire-like corona electrode 30 which is able to be moved along the upper surface 12a is provided. Then, the corona electrode 30 and the lower electrode 14 are connected to a direct-current power source 32.

Furthermore, heating means for heating and holding the first laminated body 11b, for example, a hot plate, is prepared.

Then, in a state where the piezoelectric layer 12 is heated and held by the heating means, for example, at a temperature of 100° C., a direct-current voltage of a few kV, for example, 6 kV, is applied between the lower electrode 14 and the corona electrode 30 from the direct-current power source 32, and thus a corona discharge occurs. Furthermore, in a state where the gap g is maintained, the corona electrode 30 is moved (scanned) along the upper surface 12a of the piezoelectric layer 12, and the piezoelectric layer 12 is subjected to the electric polarization processing.

During the electric polarization processing using the corona discharge (hereinafter, also referred to as corona poling processing), known rod-like moving means may be used to move the corona electrode 30.

In addition, in the corona poling processing, a method of moving the corona electrode 30 is not limited. That is, the corona electrode 30 is fixed, a moving mechanism for moving the first laminated body 11b is provided, and the polarization processing may be performed by moving the first laminated body 11b. Moving means for a known sheet-like material may be used to move the first laminated body 11b.

Furthermore, the number of corona electrodes 30 is not limited to one, and the corona poling processing may be performed by using a plurality of corona electrodes 30.

In addition, the electric polarization processing is not limited to the corona poling processing, and normal electric field poling in which a direct-current electric field is directly applied to an object to be subjected to the electric polarization processing may also be used. However, in a case where this normal electric field poling is performed, it is necessary that the upper electrode 16 is formed before the electric polarization processing.

Before the electric polarization processing, calender processing may be performed to smoothen the surface of the piezoelectric layer 12 using a heating roller or the like. By performing the calender processing, a second lamination step described below is able to be smoothly performed.

By the electric polarization processing, domains (180° domains) directed along the direction opposite to the direction in which the electric field is applied in the thickness direction are switched, that is, 180° domain motion is generated to align the directions of the domains in the thickness direction.

In the example described above, the corona discharge voltage is set to da direct-current voltage of 6 kV but is not limited thereto. The corona discharge voltage may be appropriately set according to the properties required for the transduction film, the material and thickness of each layer of the transduction film, and the like.

The second lamination step is the step of producing the second laminated body 11d by laminating the upper electrode laminated body 11c on the surface of the piezoelectric layer 12 (polymer composite piezoelectric body) of the first laminated body 11b on which the lower electrode laminated body 11a is laminated.

As illustrated in FIG. 2E, the upper electrode laminated body 11c prepared in the preparation step is laminated on the piezoelectric layer 12 side of the first laminated body 11b subjected to the polarization processing while the upper electrode 16 faces the piezoelectric layer 12.

A method of bonding the first laminated body 11b and the upper electrode laminated body 11c to each other is not particularly limited, and a method using an adhesive, a thermal compression bonding method using a heating press device, a heating roller pair, or the like may be used.

In a case where the first laminated body 11b and the upper electrode laminated body 11c are bonded together using an adhesive, the material of the adhesive is not particularly limited, and a known adhesive used for adhesion between the piezoelectric layer and the thin film electrode in the transduction film can be appropriately used. The same polymer material as the material of the viscoelastic matrix may be used as the adhesive.

The mechanical polarization processing step is the step of performing mechanical polarization processing on the second laminated body 11d prepared in the second lamination step.

Specifically, the mechanical polarization processing is processing in which the proportion of the c domains directed along the thickness direction is increased by applying shear stress to the piezoelectric layer 12 of the second laminated body 11d and thus reducing the proportion of the a domains directed along the surface direction.

The reason that the proportion of the c domains is increased by applying the shear stress of the piezoelectric layer 12 is presumed as follows.

In the case where the shear stress is applied to the piezoelectric layer 12 (the piezoelectric body particles 26), the piezoelectric body particles 26 are forced to stretch in the longitudinal direction (thickness direction). At this time, 90° domain motion is generated, and the a domains directed along the surface direction are directed along the thickness direction and become the c domains. In addition, the directions of the c domains directed along the thickness direction are not changed. As a result, it is assumed that the proportion of the a domains is reduced and thus the proportion of the c domains is increased.

As described above, by reducing the proportion of the a domains and thus increasing the c domains through the mechanical polarization processing, the intensity ratio $\alpha_1$ between the (002) plane peak intensity and the (200) plane peak intensity derived from the piezoelectric body particles is allowed to be more than or equal to 0.6 in the case where the piezoelectric layer 12 is evaluated by the X-ray diffraction method, and higher piezoelectric properties can be obtained.

Here, in the present invention, the mechanical polarization processing is performed after the electric polarization processing.

The 90° domain motion generated by the mechanical polarization processing is more likely to be generated as the 180° domain wall is eliminated.

Therefore, the 180° domain motion is generated by the electric polarization processing, the 180° domain motion is eliminated to cause a state in which the 90° domain motion is more likely to be generated, and thereafter the mechanical polarization processing is performed, whereby the 90° domain motion is generated, the a domains directed along the surface direction are directed along the thickness direction and become the c domains, and thus the proportion of the c domains can be increased.

Figure 3:
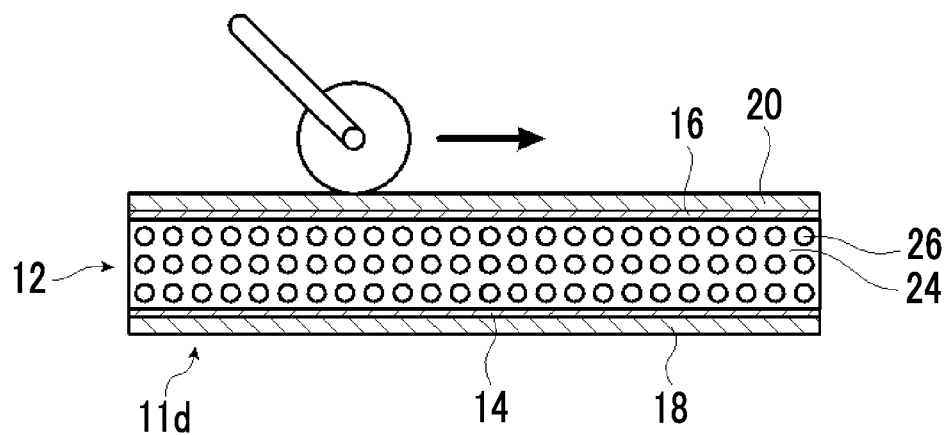
FIG. 3 is a conceptual view illustrating an example of a mechanical polarization processing step.

As a method of applying shear stress to the piezoelectric layer 12 as the mechanical polarization processing, a method of pressing a roller against one surface side of the second laminated body 11d as illustrated in FIG. 3 can be cited.

In the case where the shear stress is applied to the piezoelectric layer 12 using the roller, the type of the roller is not particularly limited, and a rubber roller, a metal roller, or the like can be appropriately used.

The value of the shear stress applied to the piezoelectric layer 12 is not particularly limited, and may be appropriately set according to the properties required for the transduction film, the material and thickness of each layer of the transduction film, and the like.

In the case where the piezoelectric layer 12 is evaluated by the X-ray diffraction method, the intensity ratio $\alpha_1$ between the (002) plane peak intensity and the (200) plane peak intensity derived from the piezoelectric body particles can be adjusted to be in a range of more than or equal to 0.67 and less than or equal to 0.75. From this viewpoint, the shear stress applied to the piezoelectric layer 12 is preferably set to 0.3 MPa to 0.5 MPa.

The shear stress applied to the piezoelectric layer 12 may be obtained by dividing the applied shear load by the cross-sectional area parallel to the shear load, or by detecting tensile strain or compressive strain caused by the compressive stress and calculating shear stress from the detection result.

In addition, in the case where the shear stress is applied to the piezoelectric layer 12 using the roller, the temperature of the transduction film and the roller is preferably set to 20° C. to 130° C., and more preferably set to 50° C. to 100° C. In a case where the temperature is too high, the polymer material becomes too soft to transmit the shear force. In a case where the temperature is low, the polymer material is too hard to change the domain ratio. Therefore, it is considered that by maintaining a temperature at which the polymer material has an appropriately soft state, the domain ratio can be easily changed.

Next, an electroacoustic transducer using the electroacoustic transduction film of the present invention will be described with reference to FIGS. 4A and 4B.

Figure 4A:
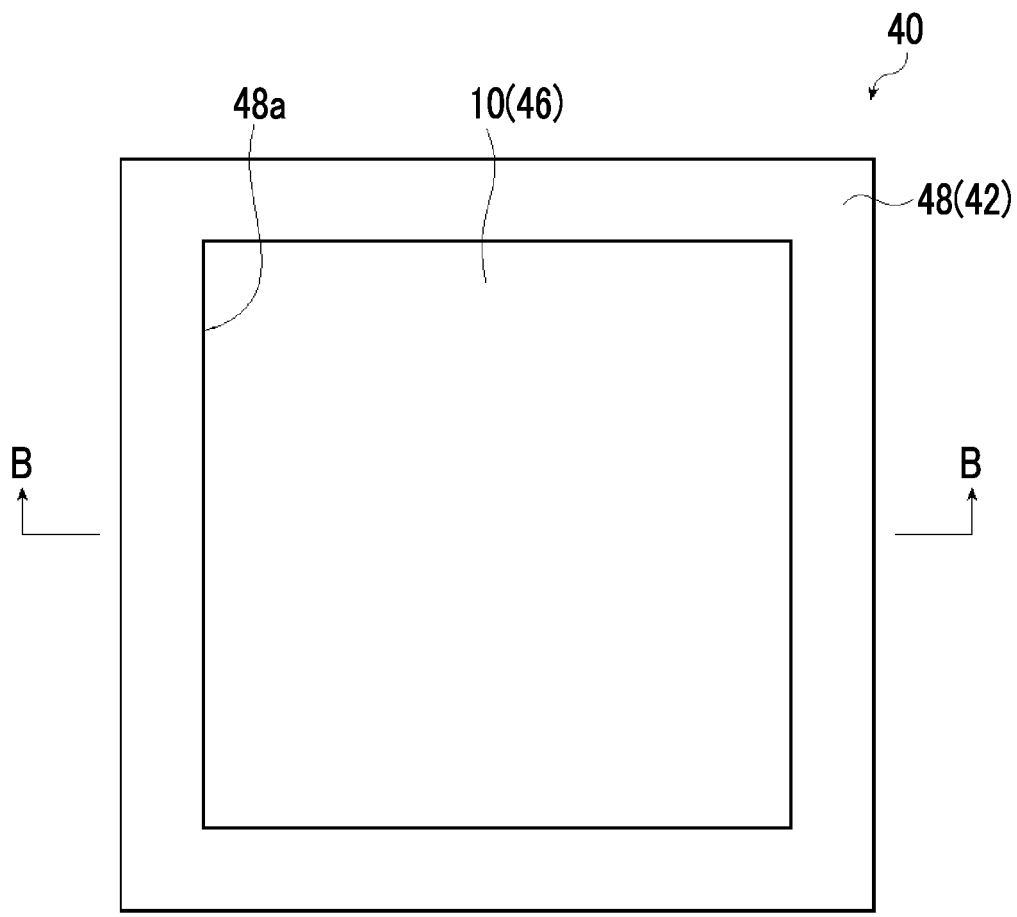
FIG. 4A is a sectional view schematically illustrating an example of an electroacoustic transducer of the present invention.
Figure 4B:
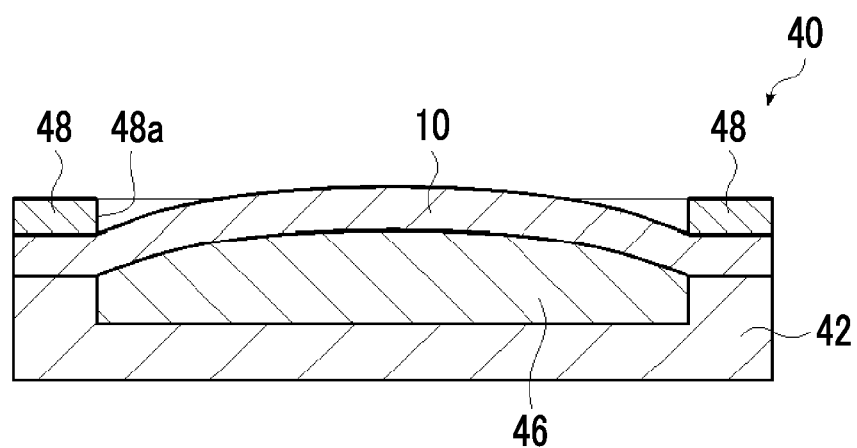
FIG. 4B is a sectional view taken along line B-B in FIG. 4A.

FIG. 4A is a front view conceptually illustrating an electroacoustic transducer 40, and FIG. 4B is a sectional view taken along line B-B in FIG. 4A.

The electroacoustic transducer 40 uses the transduction film 10 as a vibration plate.

In the electroacoustic transducer 40, in a case where the transduction film 10 is stretched in an in-plane direction due to the application of a voltage to the transduction film 10, the transduction film 10 moves upward (in the radial direction of sound) in order to absorb the stretching. Conversely, in a case where the transduction film 10 is contracted in the in-plane direction due to application of a voltage to the transduction film 10, the transduction film 10 moves downward (toward a case 42) in order to absorb the contraction. The electroacoustic transducer 40 performs a conversion between a vibration (sound) and an electrical signal by the vibrations caused by repetition of stretching and contraction of the transduction film 10.

The electroacoustic transducer 40 is configured to include the transduction film 10, the case 42, a viscoelastic supporter 46, and a pressing member 48.

The case 42 is a holding member that holds the transduction film 10 and the viscoelastic supporter 46 together with the pressing member 48, and is a box-shaped case which is formed of plastic, metal, wood, or the like and has an open surface. As illustrated in the figure, the case 42 has a thin hexahedral shape, and one of the largest surfaces is the open surface. The open portion has a regular quadrilateral shape. The 42 accommodates the viscoelastic supporter 46 therein.

The viscoelastic supporter 46 has moderate viscosity and elasticity, holds the transduction film 10 in a bent state, and imparts a constant mechanical bias at any place of the transduction film 10 to efficiently convert the stretching and contracting movement of the transduction film 10 into a forward and rearward movement (a movement in the direction perpendicular to the surface of the transduction film).

In the illustrated example, the viscoelastic supporter 46 has a quadrangular prism shape having a bottom surface shape substantially equal to the bottom surface of the case 42. In addition, the height of the viscoelastic supporter 46 is larger than the depth of the case 42.

The material of the viscoelastic supporter 46 is not particularly limited as long as the material has moderate viscosity and elasticity and suitably deforms without impeding the vibration of the piezoelectric film. As an example, wool felt, nonwoven fabric of wool felt including rayon or PET, a foamed material (foamed plastic) such as glass wool or polyurethane, polyester wool, a laminate of a plurality of sheets of paper, a magnetic fluid, a coating material, and the like are exemplified.

The specific gravity of the viscoelastic supporter 46 is not particularly limited and may be appropriately selected according to the type of the viscoelastic supporter. As an example, in a case where felt is used as the viscoelastic supporter, the specific gravity thereof is preferably 50 to 500 kg/m$^3$, and more preferably 100 to 300 kg/m$^3$. In a case where glass wool is used as the viscoelastic supporter, the specific gravity thereof is preferably 10 to 100 kg/m$^3$.

The pressing member 48 is for supporting the transduction film 10 in a state of being pressed against the viscoelastic supporter 46, and is a member formed of plastic, metal, wood, or the like in a regular quadrilateral shape with an opening at the center. The pressing member 48 has the same shape as the open surface of the case 42, and the shape of the opening is the same regular quadrilateral shape as the open portion of the case 42.

The electroacoustic transducer 40 is configured by accommodating the viscoelastic supporter 46 in the case 42, covering the case 42 and the viscoelastic supporter 46 with the transduction film 10, and fixing the pressing member 48 to the case 42 in a state in which the periphery of the transduction film 10 is brought into contact with the open surface of the case 42 by the pressing member 48.

A method of fixing the pressing member 48 to the case 42 is not particularly limited, and various known methods such as a method using screws or bolts and nuts and a method using a holding device are able to be used.

In the electroacoustic transducer 40, the height (thickness) of the viscoelastic supporter 46 is greater than the height of the inner surface of the case 42. That is, in a state before the transduction film 10 and the pressing member 48 are fixed, the viscoelastic supporter 46 is in a state protruding from the upper surface of the case 42.

Therefore, in the electroacoustic transducer 40, the viscoelastic supporter 46 is held in a state in which the viscoelastic supporter 46 is pressed downward by the transduction film 10 and decreases in thickness toward the peripheral portion of the viscoelastic supporter 46. That is, at least a portion of the principal surface of the transduction film 10 is held in a bent state. Accordingly, a bent portion is formed in at least a portion of the transduction film 10. In the electroacoustic transducer 40, the bent portion serves as a vibration surface. In the following description, the bent portion is also referred to as a vibration surface.

At this time, it is preferable that the entire surface of the viscoelastic supporter 46 is pressed in the surface direction of the transduction film 10 so that the thickness decreases over the entire surface. That is, it is preferable that the entire surface of the transduction film 10 is pressed and supported by the viscoelastic supporter 46.

In addition, it is preferable that the bent portion formed in this way gradually changes in curvature from the center to the peripheral portion. Accordingly, the resonance frequencies are distributed, resulting in a wider band.

In addition, in the electroacoustic transducer 40, the viscoelastic supporter 46 is in a state of being compressed more in the thickness direction as it approaches the pressing member 48. However, due to the static viscoelastic effect (stress relaxation), a constant mechanical bias can be maintained at any place of the transduction film 10. Accordingly, the stretching and contracting movement of the transduction film 10 is efficiently converted into a forward and rearward movement, so that it is possible to obtain a flat electroacoustic transducer 40 that is thin, achieves a sufficient sound volume, and has excellent acoustic properties.

In the electroacoustic transducer 40 having such a configuration, a region of the transduction film 10 corresponding to the opening of the pressing member 48 serves as the bent portion that actually vibrates. That is, the pressing member 48 is a portion that defines the bent portion.

In an electroacoustic transducer which uses a transduction film having piezoelectric properties, it is easy to increase the relative size of a vibration plate to the entire unit compared to a cone speaker generally having a circular vibration plate, and miniaturization is facilitated.

From the above viewpoint, the width of the edge portion of the pressing member 48 is preferably less than or equal to 20 mm, and preferably 1 mm to 10 mm.

Furthermore, it is preferable that the surface of the electroacoustic transducer 40 on the transduction film 10 side and the bent portion are similar. That is, it is preferable that the outer shape of the pressing member 48 and the shape of the opening are similar.

In addition, in the electroacoustic transducer 40, the pressing force of the viscoelastic supporter 46 against the transduction film 10 is not particularly limited, and is 0.005 to 1.0 MPa and particularly preferably about 0.02 to 0.2 MPa in terms of surface pressure at a position where the surface pressure is low.

Moreover, although the thickness of the viscoelastic supporter 46 is not particularly limited, the thickness thereof before being pressed is 1 to 100 mm, and particularly preferably 10 to 50 mm.

In the illustrated example, the configuration in which the viscoelastic supporter 46 having viscoelasticity is used is provided, but is not limited thereto, and a configuration using an elastic supporter having at least elasticity may be provided.

For example, a configuration including an elastic supporter having elasticity instead of the viscoelastic supporter 46 may be provided.

As the elastic supporter, natural rubber and various synthetic rubbers are exemplified.

Here, in the electroacoustic transducer 40 illustrated in FIG. 4A, the entire peripheral area of the transduction film 10 is pressed against the case 42 by the pressing member 48, but the present invention is not limited thereto.

That is, the electroacoustic transducer using the transduction film 10 is also able to use a configuration in which the transduction film 10 is pressed against and fixed to the upper surface of the case 42 by screws, bolts and nuts, holding devices, or the like, for example, at the four corners of the case 42 without using the pressing member 48.

An O-ring or the like may be interposed between the case 42 and the transduction film 10. With this configuration, a damper effect is able to be achieved, and it is possible to prevent the vibration of the transduction film 10 from being transmitted to the case 42, and to obtain excellent acoustic properties.

In addition, the electroacoustic transducer using the transduction film 10 may not have the case 42 that accommodates the viscoelastic supporter 46.

Figure 5:
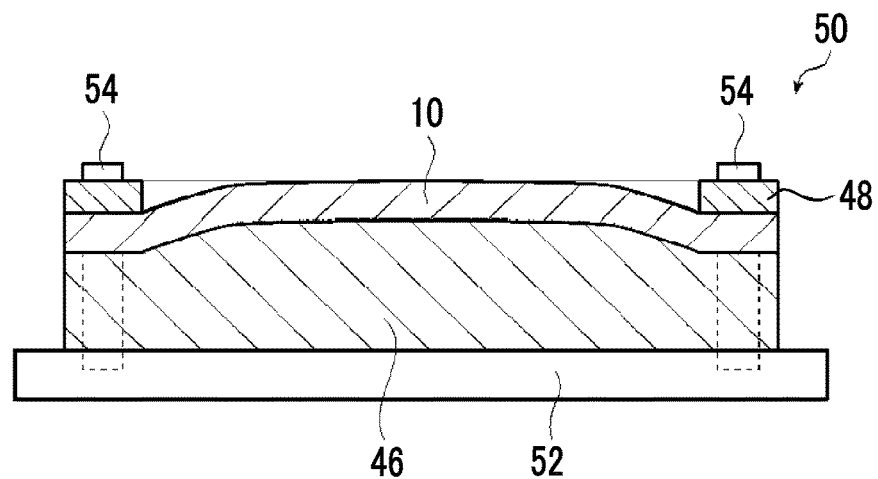
FIG. 5 is a sectional view conceptually illustrating another example of the electroacoustic transducer of the present invention.

That is, for example, as conceptually illustrated by a sectional view of an electroacoustic transducer 50 in FIG. 5, the viscoelastic supporter 46 is placed on a support plate 52 having rigidity, the transduction film 10 is placed to cover the viscoelastic supporter 46, the same pressing member 48 as described above is placed on the peripheral portion thereof. Next, a configuration in which the pressing member 48 is fixed to the support plate 52 by screws 54 or the like to press the viscoelastic supporter 46 together with the pressing member 48 is also able to be used.

The size of the support plate 52 may be greater than the viscoelastic supporter 46. Furthermore, by using various vibration plates formed of polystyrene, foamed PET, or carbon fiber as the material of the support plate 52, an effect of further amplifying the vibration of the electroacoustic transducer can be expected.

Moreover, the electroacoustic transducer is not limited to the configuration that presses the periphery, and for example, a configuration in which the center of the laminated body of the viscoelastic supporter 46 and the transduction film 10 is pressed by some means is also able to be used.

That is, various configurations are able to be used by the electroacoustic transducer as long as the transduction film 10 is held in a bent state.

Alternatively, a configuration in which a resin film is attached to the transduction film 10 to apply tension thereto (bend) may also be adopted. By configuring the transduction film 10 to be held with the resin film and causing the transduction film 10 to be held in a bent state, a flexible speaker is able to be obtained.

Alternatively, the transduction film 10 may be configured to be stretched over a bent frame.

In the example illustrated in FIGS. 4A and 4B, the configuration in which the transduction film 10 is pressed against the viscoelastic supporter 46 so as to be supported using the pressing member 48 is provided, but is not limited thereto. For example, a configuration in which the end portion of the transduction film is fixed to the rear surface side of the case 42 using the transduction film 10 which is larger than the open surface of the case 42 may be provided. That is, the case 42 and the viscoelastic supporter 46 disposed in the case 42 may be covered with the transduction film 10 which is larger than the open surface of the case 42, the end portion of the transduction film 10 may be pulled toward the rear surface side of the case 42 so the transduction film 10 is pressed against the viscoelastic supporter 46 to be bent with tension, and the end portion of the transduction film may be fixed to the rear surface side of the case 42.

Alternatively, for example, a configuration in which an airtight case is used, the open end of the case is covered and closed by the transduction film, gas is introduced into the case to apply a pressure to the transduction film, and the transduction film is thus held in a convexly swollen state may be provided.

Figure 6A:
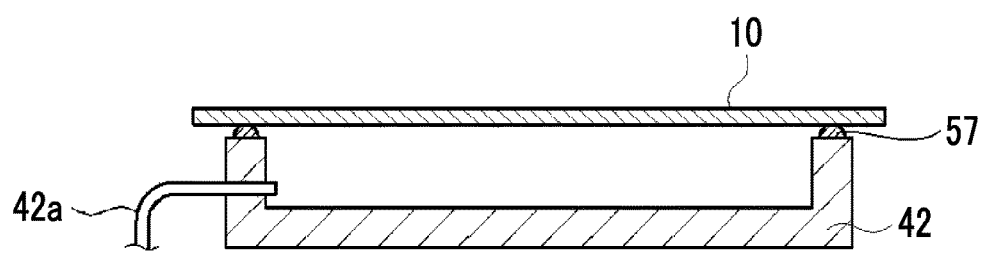
FIG. 6A is a sectional view illustrating another example of the electroacoustic transducer of the present invention.
Figure 6B:
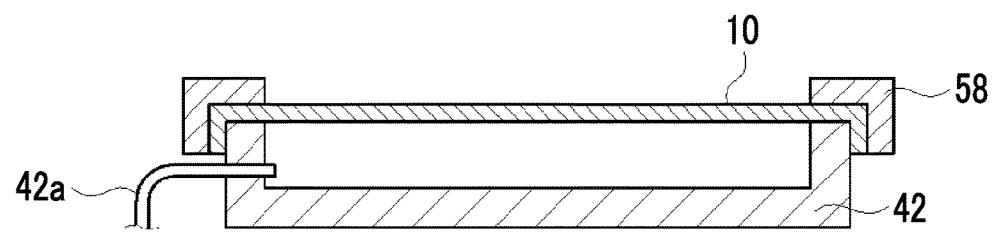
FIG. 6B is a sectional view illustrating another example of the electroacoustic transducer of the present invention.
Figure 6C:
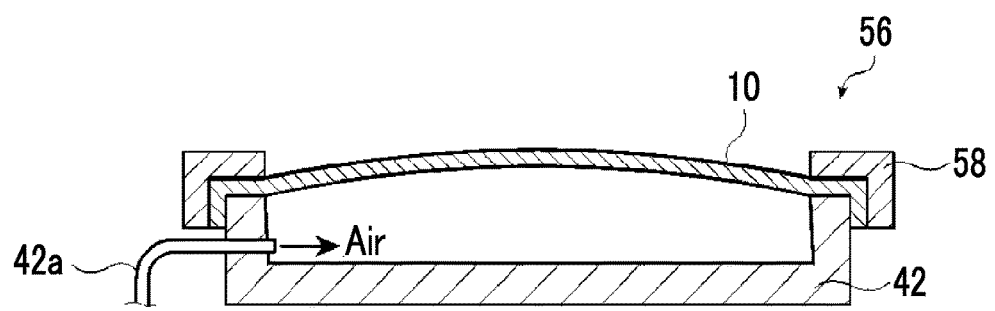
FIG. 6C is a sectional view illustrating another example of the electroacoustic transducer of the present invention.

For example, an electroacoustic transducer 56 illustrated in FIG. 6C is exemplified.

First, as illustrated in FIG. 6A, the electroacoustic transducer 56 uses an object having airtightness as the same case 42 and is provided with a pipe 42a for introducing air into the case 42.

An O-ring 57 is provided on the upper surface of the end portion on the open side of the case 42 and is covered with the transduction film 10 to close the open surface of the case 42.

Next, as illustrated in FIG. 6B, a frame-shaped pressing lid 58 having an inner periphery substantially the same as the outer periphery of the case 42 and an approximately L-shaped cross section is fitted to the outer periphery of the case 42 (the O-ring 57 is omitted in FIGS. 6B and 6C).

Accordingly, the transduction film 10 is pressed against and fixed to the case 42 such that the inside of the case 42 is airtightly closed by the transduction film 10.

Furthermore, as illustrated in FIG. 6C, air is introduced from the pipe 42a into the case 42 (a closed space formed by the case 42 and the transduction film 10) to apply a pressure to the transduction film 10, and the transduction film 10 is thus held in a convexly swollen state, thereby forming the electroacoustic transducer 56.

The pressure in the case 42 is not limited, and may be the atmospheric pressure or higher such that the transduction film 10 is convexly swollen.

The pipe 42a may be fixed or detachable. In a case where the pipe 42a is detached, it is natural that the detaching portion of the pipe is airtightly closed.

Figure 6D:
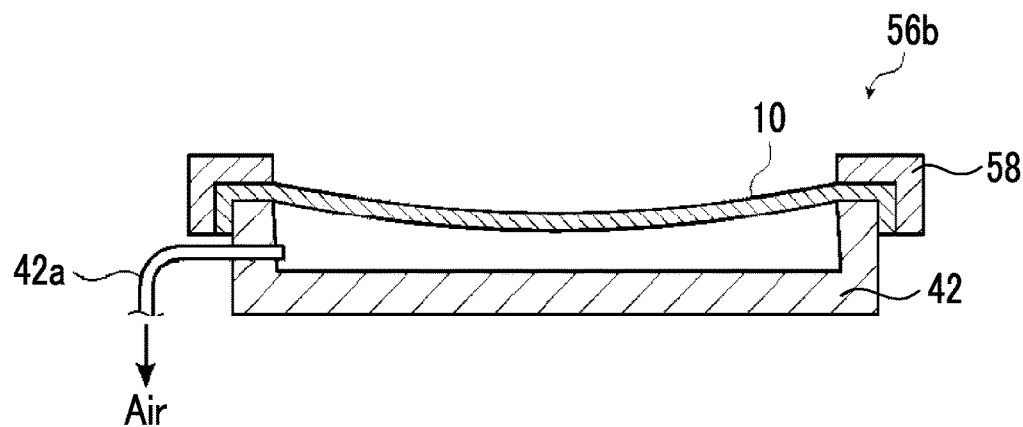
FIG. 6D is a sectional view illustrating another example of the electroacoustic transducer of the present invention.

In FIG. 6C, the configuration in which the transduction film 10 is held in the convexly swollen state by applying the pressure to the case is provided. However, as illustrated in FIG. 6D, a configuration in which the same airtight case as in FIG. 6C is used, the open end of the case is covered and closed by the transduction film, the case is degassed to apply a negative pressure to the transduction film, and the transduction film is thus held in a concave state.

Next, a flexible display which is a flexible sheet-like image display device and uses the electroacoustic transduction film of the present invention as a speaker will be described.

Specifically, the flexible display is a flexible display with a speaker, in which the transduction film 10 of the present invention is attached as a speaker to the rear surface of a flexible sheet-like display device (the surface on the opposite side of an image display surface) such as a flexible organic EL display device, a flexible liquid crystal display device, or a flexible electronic paper.

The flexible display of the present invention may be a color display or a monochrome display.

As described above, the transduction film 10 of the present invention has excellent flexibility and has no in-plane anisotropy. Therefore, the transduction film 10 of the present invention has little change in acoustic quality even in a case where the transduction film 10 is bent in any direction and also has little change in acoustic quality with a change in curvature.

Therefore, the flexible display with a speaker of the present invention formed by attaching the transduction film 10 of the present invention to the flexible image display device has excellent flexibility and can output a sound with stable acoustic quality regardless of a bending direction or bending amount due to the state held by a hand (that is, to suitably correspond to arbitrary deformation).

Various embodiments of the flexible display which uses the electroacoustic transduction film of the present invention as the speaker will be described with reference to FIGS. 7A to 7C.

Figure 7A:
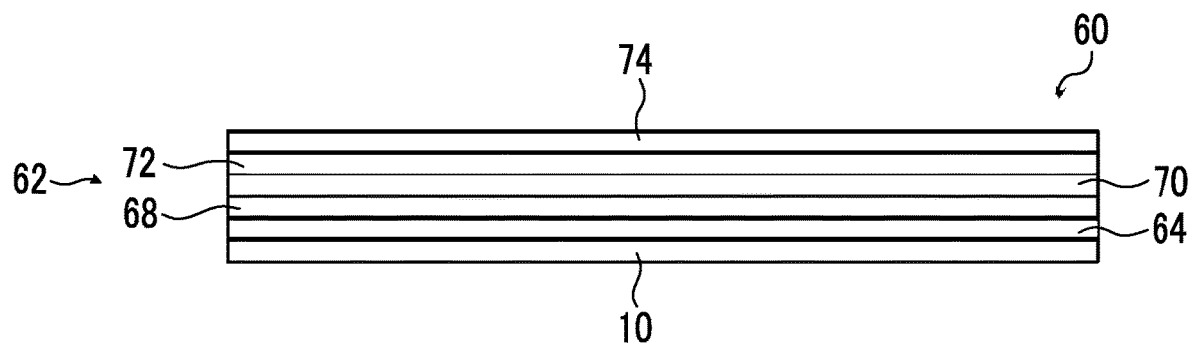
FIG. 7A is a view conceptually illustrating an example of a flexible display of the present invention, and illustrates an organic EL display.

FIG. 7A is a sectional view conceptually illustrating an example of the flexible display of the present invention in which the electroacoustic transduction film of the present invention is used in an organic EL (electroluminescence) display.

An organic EL display 60 illustrated in FIG. 7A is an organic EL flexible display with a speaker formed by attaching the transduction film 10 of the present invention to the rear surface of a flexible sheet-like organic EL display device 62.

In the flexible display of the present invention, a method of attaching the transduction film 10 of the present invention to the rear surface of a flexible sheet-like image display device such as the organic EL display device 62 is not limited. That is, any known method of attaching (bonding) sheet-like materials surface-to-surface to each other can be used.

As an example, a bonding method using an adhesive, a bonding method using thermal fusion, a method using a double-sided tape, a method using an adhesive tape, a method using a holding device that holds the end portions or end edges of a plurality of laminated sheet-like materials, such as a substantially C-shaped clamp, a method using a holding device that holds the insides of the surfaces (excluding an image display surface) of a plurality of laminated sheet-like materials, such as a rivet, a method of holding both surfaces of a plurality of laminated sheet-like materials with protective films (at least the image display side is transparent), a method using the above methods in combination, and the like are exemplified.

In a case where the display device and the transduction film 10 are bonded to each other using an adhesive or the like, the entire surfaces may be bonded, only the entire peripheries of the end portions may be bonded, spots at appropriately set points such as four corners and center portions may be bonded, or these methods may be used in combination.

In the organic EL display 60, the transduction film 10 is the (electroacoustic) transduction film 10 of the present invention described above which is configured to have the piezoelectric layer 12 formed of the polymer composite piezoelectric body, the lower thin film electrode 14 provided on one surface of the piezoelectric layer 12, the upper thin film electrode 16 provided on the other surface, the lower protective layer 18 provided on the surface of the lower thin film electrode 14, and the upper protective layer 20 provided on the surface of the upper thin film electrode 16, and is configured such that the intensity ratio $\alpha_1$=(002) plane peak intensity/((002) plane peak intensity+(200) plane peak intensity) between the (002) plane peak intensity and the (200) plane peak intensity derived from the piezoelectric body particles is more than or equal to 0.6 and less than 1.

On the other hand, the organic EL display device 62 is a known flexible sheet-like organic EL display device (organic EL display panel).

That is, as an example, the organic EL display device 62 is configured to have, on a substrate 64 formed of a plastic film or the like, an anode 68 in which a pixel electrode having a switching circuit such as a TFT is formed, have a light-emitting layer 70 which uses an organic EL material on the anode 68, a transparent cathode 72 made of ITO (indium tin oxide) on the light-emitting layer 70, and have a transparent substrate 74 formed of a transparent plastic on the cathode 72.

In addition, a hole injection layer or a hole transport layer may be provided between the anode 68 and the light-emitting layer 70, and an electron transport layer or an electron injection layer may be further provided between the light-emitting layer 70 and the cathode 72. Furthermore, a protective film such as a gas barrier film may be provided on the transparent substrate 74.

Although not illustrated in the figure, wires for driving the transduction film 10, that is, the speaker are connected to the lower electrode 14 and the upper electrode 16 of the transduction film 10. Furthermore, wires for driving the organic EL display device 62 are connected to the anode 68 and the cathode 72.

These points are also applied to an electronic paper 78, a liquid crystal display 94, and the like, which will be described later.

Figure 7B:
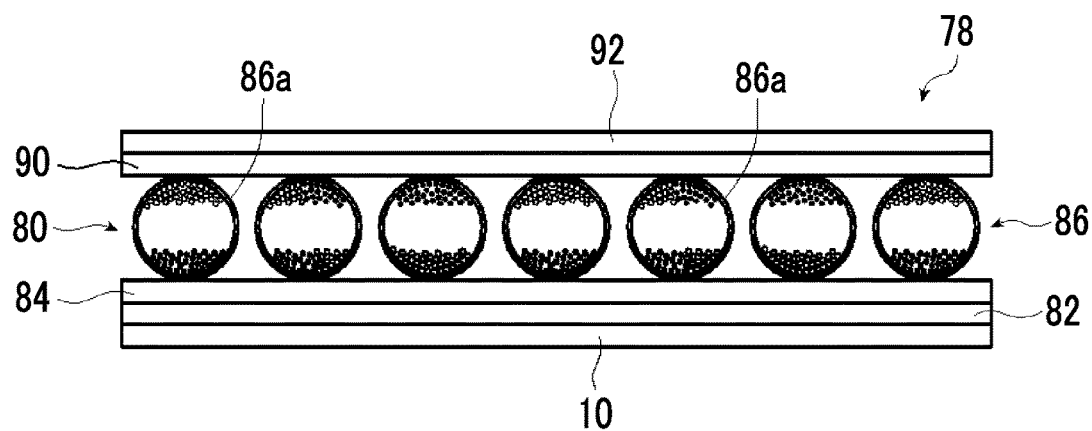
FIG. 7B is a view conceptually illustrating an example of the flexible display of the present invention, and illustrates an electronic paper.

FIG. 7B conceptually illustrates an example of the flexible display of the present invention in which the electroacoustic transduction film of the present invention is used in an electronic paper.

The electronic paper 78 illustrated in FIG. 7B is an electronic paper with a speaker formed by attaching the transduction film 10 of the present invention to the rear surface of a flexible sheet-like electronic paper device 80.

In the electronic paper 78, the transduction film 10 is the same as that described above.

On the other hand, the electronic paper device 80 is a known flexible electronic paper. That is, as an example, the electronic paper device 80 is configured to have, on a substrate 82 made of a plastic film or the like, a lower electrode 84 in which a pixel electrode having a switching circuit such as a TFT is formed, have a display layer 86 in which positively or negatively charged microcapsules 86a containing a white or black pigment are arranged on the lower electrode 84, have a transparent upper electrode 90 made of ITO or the like on the display layer 86, and have a transparent substrate 92 formed of a transparent plastic on the upper electrode 90.

The example illustrated in FIG. 7B is an example in which the flexible display of the present invention is used in the electrophoretic type electronic paper using the microcapsules. However, the present invention is not limited thereto.

That is, the flexible display of the present invention may use any type of known electronic paper, such as an electrophoretic type in which no microcapsules are used, an electrophoretic type, a chemical change type using a redox reaction or the like, an electronic granular body type, an electrowetting type, or a liquid crystal type as long as the electronic paper is in the form of a sheet having flexibility.

Figure 7C:
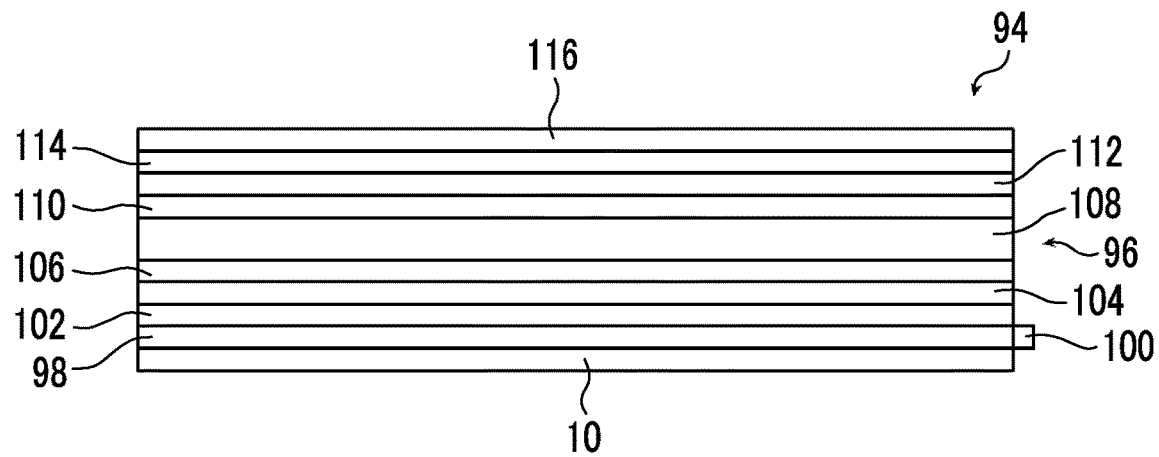
FIG. 7C is a view conceptually illustrating an example of the flexible display of the present invention, and illustrates a liquid crystal display.

FIG. 7C conceptually illustrates an example in which the electroacoustic transduction film of the present invention is used in a liquid crystal display.

The liquid crystal display 94 illustrated in FIG. 7C is a liquid crystal flexible display with a speaker formed by attaching the transduction film 10 of the present invention to the rear surface of a flexible sheet-like liquid crystal display device 96.

In the liquid crystal display 94, the transduction film 10 is the same as that described above.

On the other hand, the liquid crystal display device 96 is a known flexible sheet-like liquid crystal display device (liquid crystal display panel). That is, as an example, the liquid crystal display device 96 has a flexible edge light type light guide plate 98 and a light source 100 that receives the backlight from the end portion of the light guide plate 98. As an example, the liquid crystal display device 96 is configured to have a polarizer 102 on the light guide plate 98, have a transparent lower substrate 104 on the polarizer 102, have, on the lower substrate 104, a transparent lower electrode 106 in which a pixel electrode having a switching circuit such as a TFT is formed, have a liquid crystal layer 108 on the lower electrode 106, have a transparent upper electrode 110 made of ITO or the like on the liquid crystal layer 108, a transparent upper substrate 112 on the upper electrode 110, a polarizer 114 on the upper substrate 112, and a protective film 116 on the polarizer 114.

The flexible display of the present invention is not limited to the organic EL display, the electronic paper, and the liquid crystal display, and an image display apparatus using various display devices can be used as long as the display devices are flexible sheet-like display devices (display panels).

Next, a configuration in which the electroacoustic transduction film of the present invention is used as a microphone or a sensor for a musical instrument will be described.

The transduction film 10 of the present invention having the piezoelectric layer 12 in which the piezoelectric body particles are disposed in a polymer matrix having viscoelasticity at a normal temperature, the lower thin film electrode 14 and the upper thin film electrode 16 provided on the surfaces of the piezoelectric layer 12, and the lower protective layer 18 and the upper protective layer 20 respectively provided on the surfaces of the thin film electrodes, the piezoelectric layer 12 also has a capability of converting vibration energy into an electrical signal.

Therefore, the transduction film 10 of the present invention can also be suitably used in the microphone or sensor for a musical instrument (pickup) using this.

As an example, a vocal cord microphone is suitably exemplified.

Figure 8:
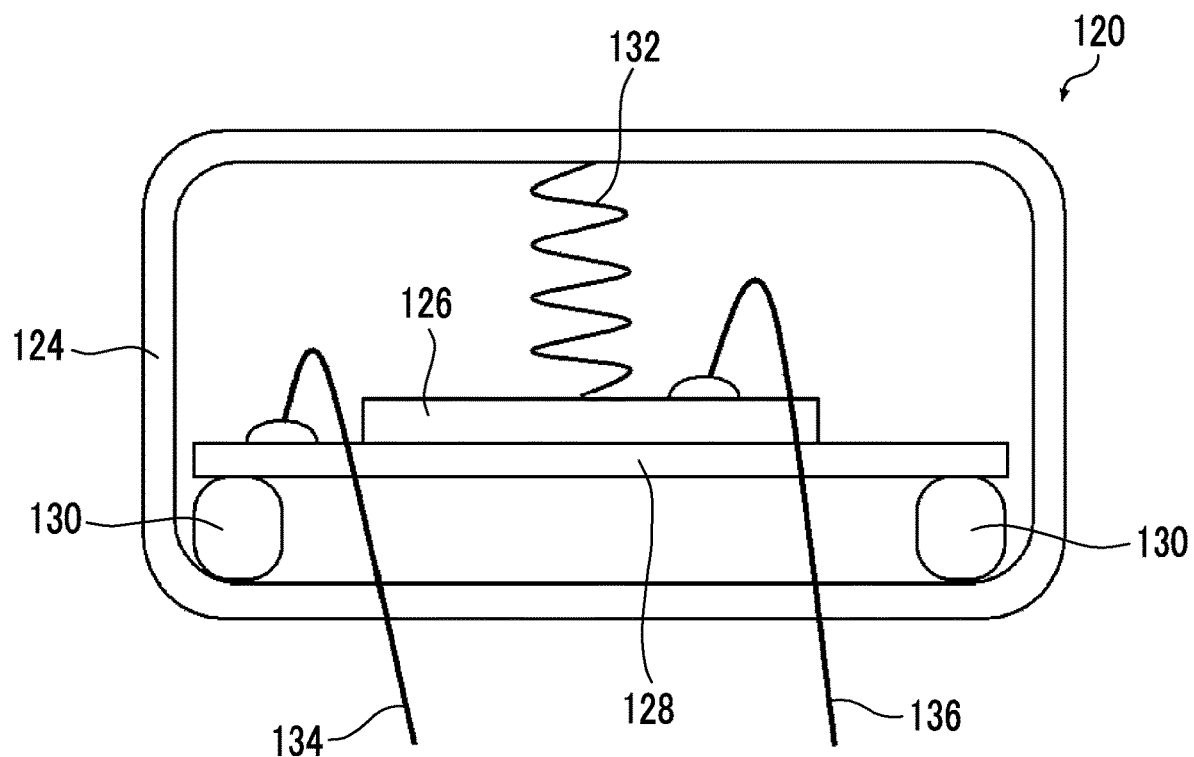
FIG. 8 is a view conceptually illustrating a configuration of a general vocal cord microphone.

FIG. 8 conceptually illustrates an example of a general vocal cord microphone.

As illustrated in FIG. 8, a general vocal cord microphone 120 in the related art has a complex configuration in which a piezoelectric ceramic 126 such as PZT is laminated on a metal plate 128 such as a brass plate, elastic cushions 130 and a spring 132 are respectively attached to the lower surface and the upper surface of this laminated body and are supported in a case 124, and signal lines 134 and 136 are drawn out from the case.

Contrary to this, the vocal cord microphone of the present invention in which the transduction film 10 of the present invention is used as a sensor for converting a sound signal into an electrical signal can be configured as a vocal cord microphone, for example, with a simple configuration in which means for attaching the transduction film 10 is provided and only a signal line for extracting the electrical signal output from the piezoelectric layer 12 (the lower electrode 14 and the upper electrode 16) is provided.

In addition, the vocal cord microphone of the present invention having such a configuration acts as a vocal cord microphone only by attaching the transduction film 10 to the vicinity of the vocal cord.

Furthermore, the vocal cord microphone in the related art in which the piezoelectric ceramic 126 and the metal plate 128 are used as illustrated in FIG. 8 has a very small loss tangent, so that resonance tends to be very strong and frequency properties extremely fluctuate, resulting in a metallic tone.

Contrary to this, as described above, since the transduction film 10 of the present invention has excellent flexibility and acoustic properties and has little change in acoustic quality during deformation, the transduction film 10 of the present invention can be attached to the throat of a person with a complex curved surface and can reliably reproduce low to high frequency sounds.

That is, according to the present invention, an ultralight and space-saving vocal cord microphone can be realized with a simple configuration in which a sound signal extremely close to a voice can be output and does not cause a wearing sensation.

In the vocal cord microphone of the present invention, a method of attaching the transduction film 10 to the vicinity of the vocal cord is not particularly limited, and various known methods of attaching a sheet-like material can be used.

Alternatively, instead of attaching the transduction film 10 directly to the vicinity of the vocal cord, the transduction film 10 may be accommodated in an extremely thin case or a bag and then attached to the vicinity of the vocal cord.

In addition, the sensor for a musical instrument of the present invention which uses the transduction film 10 of the present invention as a sensor for converting a sound signal into an electrical signal can be configured as a sensor for a musical instrument, for example, with a simple configuration in which means for attaching the transduction film 10 is provided and only a signal line for extracting the electrical signal output from the piezoelectric layer 12 (the lower electrode 14 and the upper electrode 16) is provided.

Furthermore, the sensor for a musical instrument of the present invention having such a configuration acts as a pickup only by attaching the transduction film 10 to the case surface of a musical instrument.

Like the vocal cord microphone described above, since the transduction film 10 of the present invention is thin and sufficiently flexible, the sensor for a musical instrument of the present invention has excellent flexibility and acoustic properties and has little change in acoustic quality during deformation. Therefore, the transduction film 10 of the present invention can be attached to the case surface of a musical instrument with a complex curved surface and can reliably reproduce the sound of the musical instrument at low to high frequencies.

Furthermore, the sensor for a musical instrument of the present invention has little mechanical restraint on the case surface of the musical instrument and thus can minimize the influence of the attachment of the pickup on the original sound of the musical instrument.

Like the vocal cord microphone described above, in the sensor for a musical instrument of the present invention, a method of attaching the sensor for a musical instrument to a musical instrument is not particularly limited, and various known methods of attaching a sheet-like material can be used. Alternatively, in the sensor for a musical instrument of the present invention, the transduction film 10 may be accommodated in an extremely thin case or a bag and then attached to the musical instrument.

As described above, the electroacoustic transduction film of the present invention, the manufacturing method thereof, the electroacoustic transducer, the flexible display, the vocal cord microphone, and the sensor for a musical instrument are described in detail, but the present invention is not limited to the examples described above, and various improvements or modifications may be performed within a range not deviating from the gist of the present invention.

EXAMPLES

Hereinafter, the present invention will be described in more detail with reference to specific examples of the present invention. The present invention is not limited the examples, and the materials, use amounts, proportions, processing contents, processing procedures, and the like described in the following examples can be appropriately modified without departing from the gist of the present invention.

Example 1

According to the method illustrated in FIGS. 2A to 2E and FIG. 3 described above, the transduction film 10 illustrated in FIG. 1 was prepared.

(Preparation Step)

A lower electrode laminated body 11a and an upper electrode laminated body 11c in each of which a copper thin film having a thickness of 0.1 μm was vacuum vapor deposited on a PET film having a thickness of 4 μm were prepared. That is, in this example, the upper electrode 16 and the lower electrode 14 are copper vapor deposition thin films having a thickness of 0.1 μm, and the upper protective layer 20 and the lower protective layer 18 are PET films having a thickness of 4 μm.

In order to obtain good handleability during the process, as the PET film, a film with a separator (temporary supporter PET) having a thickness of 50 μm attached thereto was used, and the separator of each protective layer was removed after the thermal compression bonding of the upper electrode laminated body 11c.

(First Lamination Step)

First, cyanoethylated PVA (CR-V manufactured by Shin-Etsu Chemical Co., Ltd.) was dissolved in methyl ethyl ketone (MEK) at the following compositional ratio. Thereafter, PZT particles were added to this solution at the following compositional ratio, and were dispersed by using a propeller mixer (rotation speed 2000 rpm), and thus a coating material for forming the piezoelectric layer 12 was prepared.

PZT Particles 300 parts by mass
Cyanoethylated PVA 15 parts by mass
MEK 85 parts by mass In addition, the PZT particles were obtained by sintering commercially available PZT raw material powder at 1000° C. to 1200° C. and thereafter crushing and classifying the resultant so as to have an average particle diameter of 5 μm.

The coating material for forming the piezoelectric layer 12 prepared as described above was applied onto the lower electrode 14 (the copper vapor deposition thin film) of the lower electrode laminated body 11a prepared in advance by using a slide coater. Furthermore, the coating material was applied such that the film thickness of the coating film after being dried was 20 μm.

Next, a material in which the coating material was applied onto the lower electrode laminated body 11a was heated and dried in an on a hot plate at 120° C. such that MEK was evaporated. Accordingly, the first laminated body 11b was prepared in which the lower electrode 14 made of copper was provided on the lower protective layer 18 made of PET and the piezoelectric layer 12 (polymer composite piezoelectric body) having a thickness of 20 μm was formed thereon.

(Electric Polarization Processing Step)

The electric polarization processing was performed on the piezoelectric layer 12 of the first laminated body 11b by the corona poling illustrated in FIGS. 2C and 2D described above. Furthermore, the electric polarization processing was performed by setting the temperature of the piezoelectric layer 12 to 100° C., and applying a direct-current voltage of 6 kV between the lower electrode 14 and the corona electrode 30 so as to cause corona discharge to occur.

(Second Lamination Step)

The upper electrode laminated body 11c was laminated on the first laminated body 11b which was subjected to the electric polarization processing while the upper electrode 16 (copper thin film side) faced the piezoelectric layer 12.

Next, the laminated body of the first laminated body 11b and the upper electrode laminated body 11c was subjected to thermal compression bonding at 120° C. by using a laminator device, and thus the piezoelectric layer 12 adhered to the upper electrode 16 and the lower electrode 14 such that the second laminated body 11d was prepared.

(Mechanical Polarization Processing Step)

Next, the mechanical polarization processing was performed by applying shear stress to the prepared second laminated body 11d using a rubber roller (urethane rubber with a SUS core) such that the transduction film 10 was prepared.

The shear stress applied to the piezoelectric layer 12 was set to 0.2 MPa.

<Measurement of Intensity Ratio>

Figure 10:
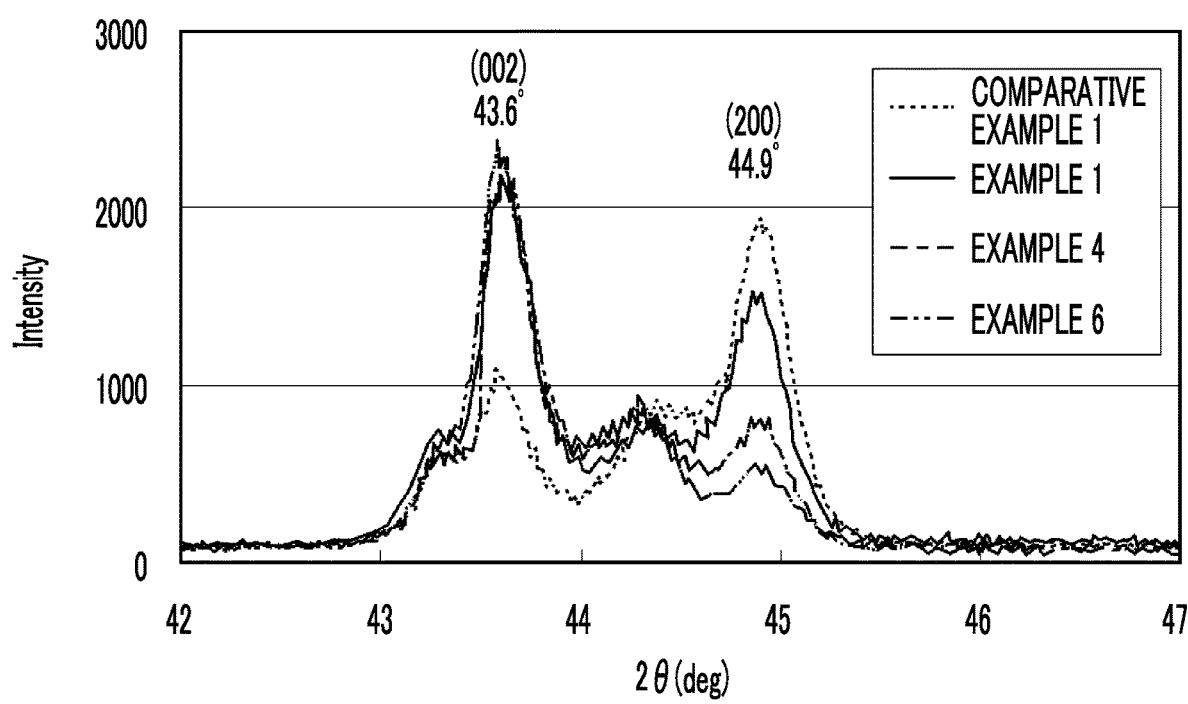
FIG. 10 is a graph showing XRD patterns in examples and comparative examples.

Regarding the prepared transduction film, the XRD pattern for the crystal structure of the piezoelectric body particles 26 in the piezoelectric layer 12 was measured by the X-ray diffraction method (XRD) using the X-ray diffractometer (Rint Ultima III manufactured by Rigaku Corporation) (see FIG. 10).

From the measured XRD pattern, the (002) plane peak intensity at around 43.5° and the (200) plane peak intensity at around 45° were read, and the intensity ratio $\alpha_1$=(002) plane peak intensity/((002) plane peak intensity+(200) plane peak intensity) between the (002) plane peak intensity and the (200) plane peak intensity was obtained.

The intensity ratio $\alpha_1$ was 0.600.

Examples 2 to 8

The electroacoustic transduction film 10 was prepared in the same manner as in Example 1 except that the shear stress applied to the piezoelectric layer 12 in the mechanical polarization processing step was changed to values shown in Table 1.

In addition, the XRD pattern of each of the prepared transduction films was measured in the same manner as in Example 1, and the intensity ratio $\alpha_1$ was obtained.

Comparative Example 1

An electroacoustic transduction film was prepared in the same manner as in Example 1 except that the electric polarization processing and the mechanical polarization processing were not performed.

In addition, the XRD pattern of the prepared transduction film was measured in the same manner as in Example 1, and the intensity ratio $\alpha_1$ was obtained.

Comparative Examples 2 to 4

An electroacoustic transduction film was prepared in the same manner as in Example 1 except that the mechanical polarization processing was not performed and the corona discharge voltage in the electric polarization processing step was changed as shown in Table 1.

In addition, the XRD pattern of each of the prepared transduction films was measured in the same manner as in Example 1, and the intensity ratio $\alpha_1$ was obtained.

[Evaluation]
<Sound Pressure Sensitivity>
(Preparation of Electroacoustic Transducer)

A circular test piece of ϕ70 mm was cut from the prepared transduction film 10 and was assembled into the case 42 to prepare the electroacoustic transducer 56b as illustrated in FIG. 6D, and the sound pressure sensitivity thereof was measured.

The case 42 is a cylindrical container having an open surface, and a plastic cylindrical container having an open surface size of ϕ60 mm and a depth of 10 mm was used.

The transduction film 10 was disposed so as to cover the opening of the case 42 and the peripheral portion thereof was fixed by the pressing lid 58. Thereafter, air in the case 42 was evacuated from the pipe 42a to maintain the pressure in the case 42 at 0.09 MPa such that the transduction film 10 was bent in a concave shape.

(Measurement of Sound Pressure)

The sound pressure level of the prepared electroacoustic transducer was measured to obtain the sound pressure sensitivity.

Figure 9:
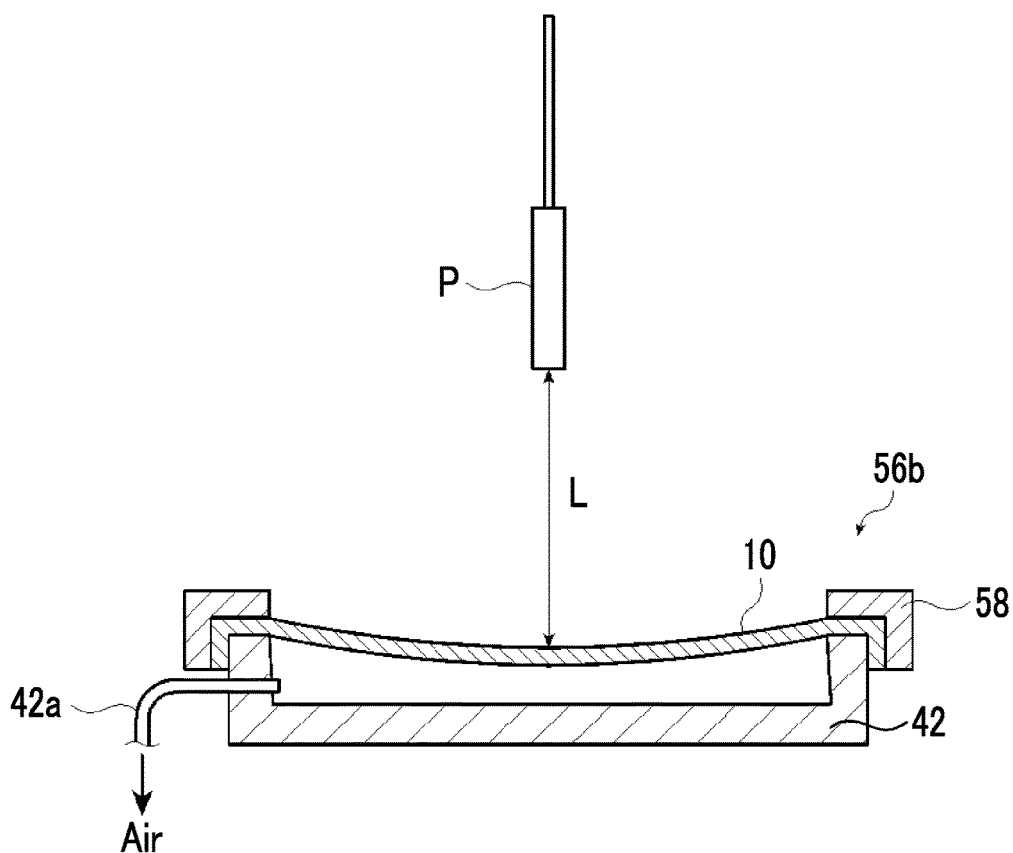
FIG. 9 is a conceptual view illustrating a method of measuring a sound pressure sensitivity in examples.

Specifically, as illustrated in FIG. 9, a microphone P was placed to face the center of the transduction film 10 of an electroacoustic transducer 56b at a position of 0.5 m apart therefrom, a sine wave at 1 kHz and 1 W was input between the upper electrode and the lower electrode of the electroacoustic transducer, and the sound pressure level was measured and converted into a sound pressure sensitivity.

Evaluation results are shown in Table 1.

In addition, the XRD pattern of Examples 1, 4, and 6 and Comparative Example 1 are shown in FIG. 10.

Figure 11A:
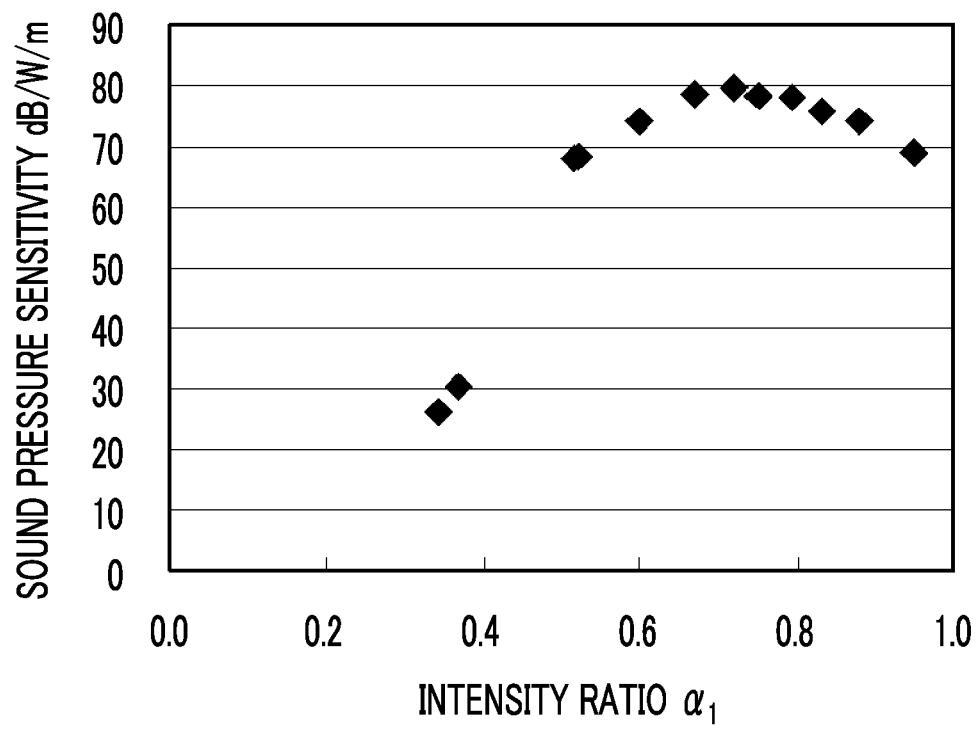
FIG. 11A is a graph showing the relationship between an intensity ratio $\alpha^1$ and a sound pressure sensitivity.
Figure 11B:
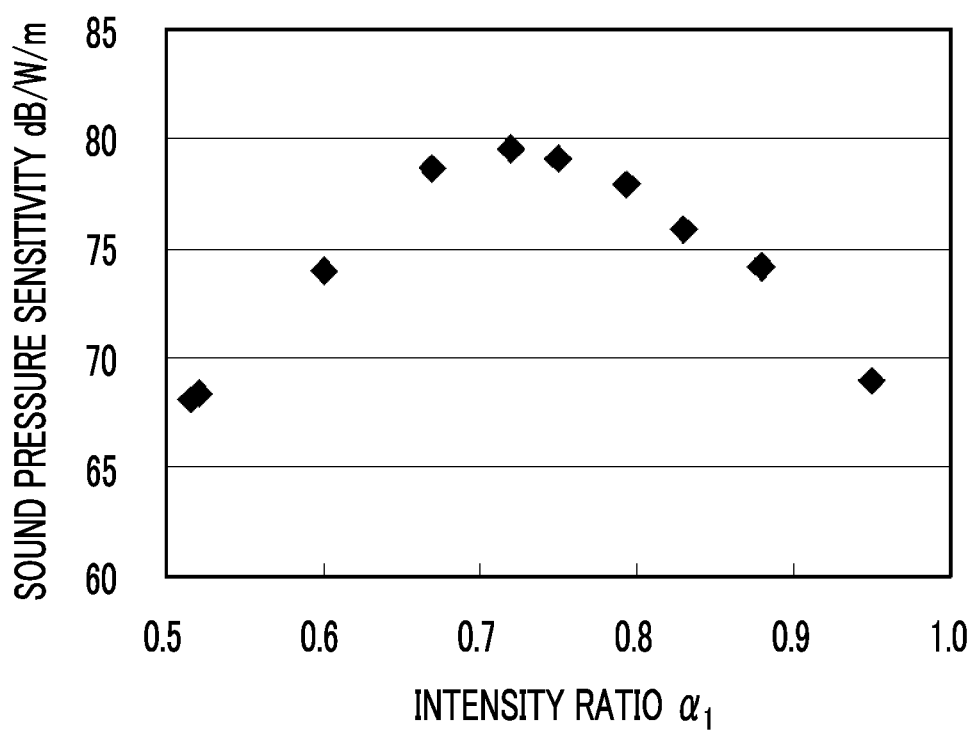
FIG. 11B is a graph showing the relationship between an intensity ratio $\alpha_1$ and a sound pressure sensitivity.

A graph showing the relationship between the value of the obtained sound pressure sensitivity and the intensity ratio $\alpha_1$ is shown in FIG. 11A, and FIG. 11B shows an enlarged graph of a region with an intensity ratio $\alpha_1$ of more than or equal to 0.5.

In addition, as can be seen from the graph shown in FIG. 10, it can be seen that the (002) plane peak intensity can be increased by performing the electric polarization processing and the mechanical polarization processing.

Furthermore, as can be seen from the graphs in FIGS. 11A and 11B, regarding the correlation between the intensity ratio $\alpha_1$ between the (002) plane peak intensity and the (200) plane peak intensity derived from the piezoelectric body particles and the sound pressure sensitivity, it can be seen that the more the intensity ratio $\alpha_1$, the higher the sound pressure sensitivity, and a peak appears at around an intensity ratio $\alpha_1$ of 0.7.

In addition, it can be seen from the comparison between Comparative Examples 2 to 4 that by performing only the electric polarization processing, the intensity ratio $\alpha_1$ is increased only to about 0.55 even when the corona discharge voltage is further increased.

On the other hand, it can be seen from the examples that by performing the mechanical polarization processing after performing the electric polarization processing, the intensity ratio $\alpha_1$ can be increased to 0.6 or more, and thus the sound pressure sensitivity can be improved.

In addition, it can be seen from the comparison between Examples 1 to 8 that by setting the intensity ratio $\alpha_1$ to be in a range of 0.67 to 0.75, the sound pressure sensitivity can be more than or equal to 78 dB/(W·m), which is preferable.

In addition, it can be seen that it is preferable to set the shear stress applied to the piezoelectric layer during the mechanical polarization processing to be in a range of 0.3 to 0.5 MPa.

From the above results, the effect of the present invention is obvious.

EXPLANATION OF REFERENCES

10: electroacoustic transduction film
11a: lower electrode laminated body
11b: first laminated body
11c: upper electrode laminated body
11d: second laminated body
12: piezoelectric layer
14: lower thin film electrode

TABLE 1

|  | Electric polarization processing Corona discharge voltage kV | Mechanical polarization processing Shear stress MPa | Intensity ratio α1 | Evaluation Sound pressure sensitivity dB/(W · m) |
| --- | --- | --- | --- | --- |
| Example 1 | 6 | 0.2 | 0.600 | 74.00 |
| Example 2 | 6 | 0.3 | 0.670 | 78.60 |
| Example 3 | 6 | 0.4 | 0.720 | 79.50 |
| Example 4 | 6 | 0.5 | 0.750 | 78.50 |
| Example 5 | 6 | 0.6 | 0.794 | 77.90 |
| Example 6 | 6 | 0.8 | 0.831 | 75.90 |
| Example 7 | 6 | 1 | 0.880 | 74.20 |
| Example 8 | 6 | 2 | 0.950 | 69.00 |
| Comparative Example 1 | — | — | 0.342 | 26.20 |
| Comparative Example 2 | 3 | — | 0.367 | 30.50 |
| Comparative Example 3 | 6 | — | 0.516 | 68.10 |
| Comparative Example 4 | 8 | — | 0.521 | 68.30 |

It can be seen from Table 1 that the sound pressure sensitivity in Examples 1 to 8 of the electroacoustic transduction film of the present invention is further improved compared to that in Comparative Examples 1 to 4.

16: upper thin film electrode
18: lower protective layer
20: upper protective layer
24: viscoelastic matrix 26: piezoelectric body particles
30: corona electrode
32: direct-current power source
40, 50, 56, 56b: electroacoustic transducer
42, 124: case
46: viscoelastic supporter
48: pressing member
52: support plate
54: screw
57: O-ring
58: pressing lid
60: organic EL display
62: organic EL display device
64, 82: substrate
68: anode
70: light-emitting layer
72: cathode
74, 92: transparent substrate
78: electronic paper
80: electronic paper device
84, 106: lower electrode
86: display layer
86a: microcapsule
90, 110: upper electrode
94: liquid crystal display
96: liquid crystal display device
98: light guide plate
100: light source
102, 114: polarizer
104: lower substrate
108: liquid crystal layer
112: upper substrate
116: protective film
120: vocal cord microphone
126: piezoelectric ceramic
128: metal plate
130: cushion
132: spring
134, 136: signal line

What is claimed is:

1. An electroacoustic transduction film comprising:
a polymer composite piezoelectric body in which piezoelectric body particles are dispersed in a viscoelastic matrix formed of a polymer material having viscoelasticity at a normal temperature;
two thin film electrodes laminated on both surfaces of the polymer composite piezoelectric body; and
two protective layers respectively laminated on the two thin film electrodes,
wherein the polymer material has a cyanoethyl group; and
an intensity ratio $\alpha_1 = (002)$ plane peak intensity/((002) plane peak intensity+(200) plane peak intensity) between a (002) plane peak intensity and a (200) plane peak intensity derived from the piezoelectric body particles in a case where the polymer composite piezoelectric body is evaluated by an X-ray diffraction method is more than or equal to 0.6 and less than 1.

2. The electroacoustic transduction film according to claim 1,
wherein the intensity ratio $\alpha_1$ is more than or equal to 0.67 and less than or equal to 0.75.

3. The electroacoustic transduction film according to claim 1,
wherein the polymer material is cyanoethylated polyvinyl alcohol.

4. The electroacoustic transduction film according to claim 2,
wherein the polymer material is cyanoethylated polyvinyl alcohol.

5. The electroacoustic transduction film according to claim 4,
wherein the piezoelectric body particles are formed of ceramics particles having a perovskite type or wurtzite type crystal structure.

6. The electroacoustic transduction film according to claim 5,
wherein the piezoelectric body particles are formed of ceramics particles having at least one of lead zirconate titanate (PZT), lead lanthanum zirconate titanate (PLZT), barium titanate ($BaTiO_3$), zinc oxide (ZnO), and a solid solution (BFBT) of barium titanate and bismuth ferrite ($BiFe_3$).

7. The electroacoustic transduction film according to claim 1,
wherein the piezoelectric body particles are formed of ceramics particles having a perovskite type or wurtzite type crystal structure.

8. The electroacoustic transduction film according to claim 1,
wherein the piezoelectric body particles are formed of ceramics particles having at least one of lead zirconate titanate (PZT), lead lanthanum zirconate titanate (PLZT), barium titanate ($BaTiO_3$), zinc oxide (ZnO), and a solid solution (BFBT) of barium titanate and bismuth ferrite ($BiFe_3$).

9. An electroacoustic transducer comprising:
the electroacoustic transduction film according to claim 1.

10. A flexible display comprising:
the electroacoustic transduction film according to claim 1 attached to a surface of the flexible display having flexibility, the surface being opposite to an image display surface.

11. A vocal cord microphone comprising:
the electroacoustic transduction film according to claim 1 used as a sensor.

12. A sensor for a musical instrument comprising:
the electroacoustic transduction film according to claim 1 used as a sensor.

* * * * *